United States Patent
Ishida et al.

(10) Patent No.: US 9,412,755 B2
(45) Date of Patent: *Aug. 9, 2016

(54) MANUFACTURING METHOD FOR SEMICONDUCTOR DEVICE

(71) Applicant: Synaptics Display Devices GK, Tokyo (JP)

(72) Inventors: Hiroshi Ishida, Tokyo (JP); Kazuhiko Sato, Tokyo (JP)

(73) Assignee: Synaptics Display Devices GK, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/572,115

(22) Filed: Dec. 16, 2014

(65) Prior Publication Data

US 2015/0171101 A1    Jun. 18, 2015

(30) Foreign Application Priority Data

Dec. 17, 2013 (JP) ................................. 2013-259908

(51) Int. Cl.
 *H01L 21/8234* (2006.01)
 *H01L 27/115* (2006.01)
 *H01L 21/28* (2006.01)
 *H01L 29/66* (2006.01)
 (Continued)

(52) U.S. Cl.
CPC .... *H01L 27/11573* (2013.01); *H01L 21/28282* (2013.01); *H01L 21/823462* (2013.01); *H01L 29/66537* (2013.01); *H01L 29/792* (2013.01); *H01L 21/26586* (2013.01); *H01L 29/4916* (2013.01)

(58) Field of Classification Search
CPC ....... H01L 21/02; H01L 21/266; H01L 21/28; H01L 21/306; H01L 21/3213; H01L 27/115; H01L 29/49; H01L 29/51; H01L 21/28282; H01L 21/823462; H01L 27/11573; H01L 29/66537; H01L 29/792; H01L 21/26586; H01L 21/4916

USPC ......................................................... 438/275
See application file for complete search history.

(56) References Cited

U.S. PATENT DOCUMENTS 9,214,345 B2 * 12/2015 Ohashi .................. C08L 101/00
2002/0100930 A1 * 8/2002 Yaegashi ........... H01L 21/26513
                                                                257/315

(Continued)

FOREIGN PATENT DOCUMENTS

JP        2012216857 A    11/2012

*Primary Examiner* — Thanh T Nguyen
(74) *Attorney, Agent, or Firm* — Patterson + Sheridan, LLP

(57) ABSTRACT

In a manufacturing method for a semiconductor device provided with a MONOS-type FET for a non-volatile memory and high-voltage and low-voltage MOSFETs, a groove having a predetermined depth is formed in a region in which the high-voltage MOSFET on a semiconductor substrate is formed, and an oxide film serving as a gate insulating film of the high-voltage MOSFET is formed within the formed groove by thermal oxidation. Thereafter, a gate electrode film of the low-voltage MOSFET is formed on the entire surface of the semiconductor substrate. Thereafter, a region for the MONOS-type FET is opened, the semiconductor surface of the semiconductor substrate is exposed, and a first potential barrier film, a charge storage film, and a second potential barrier film are sequentially deposited, to thereby form a charge storage three-layer film. A gate electrode film of the MONOS-type FET is formed on the formed charge storage three-layer film.

14 Claims, 26 Drawing Sheets

(51) Int. Cl.
*H01L 29/792* (2006.01)
*H01L 29/49* (2006.01)
*H01L 21/265* (2006.01)

(56) References Cited

U.S. PATENT DOCUMENTS

| | | | |
|---|---|---|---|
| 2005/0093047 A1* | 5/2005 | Goda | H01L 27/105 257/300 |
| 2005/0224864 A1* | 10/2005 | Hashimoto | H01L 21/28202 257/315 |
| 2009/0095995 A1* | 4/2009 | Kawashima | H01L 27/0629 257/296 |
| 2009/0250768 A1* | 10/2009 | Sato | H01L 21/823462 257/392 |
| 2010/0200930 A1 | 8/2010 | Fujii et al. | |
| 2011/0095348 A1* | 4/2011 | Chakihara | H01L 21/28273 257/298 |
| 2015/0171102 A1* | 6/2015 | Ishida | H01L 21/823462 438/587 |
| 2015/0171168 A1* | 6/2015 | Ishida | H01L 29/66833 257/324 |

\* cited by examiner

US 9,412,755 B2

MANUFACTURING METHOD FOR SEMICONDUCTOR DEVICE

CROSS-REFERENCE TO RELATED APPLICATIONS

The Present application claims priority from Japanese application JP 2013-259908 filed on Dec. 17, 2013, the content of which is hereby incorporated by reference into this application.

BACKGROUND

The present invention relates to a manufacturing method for a semiconductor device, and particularly relates to a technique which is capable of being suitably used for a semiconductor device in which a non-volatile memory and a normal MISFET (Metal Insulator Semiconductor Field Effect Transistor) are combined.

Semiconductor integrated circuits (LSI: Large Scale Integrated circuit) having a non-volatile memory combined with a logic circuit, a memory circuit, an analog circuit or the like have been in widespread use. MOSFETs (Metal Oxide Semiconductor Field Effect Transistors) including a silicon oxide ($SiO_2$) film in a gate insulating film, among MOSFETs, are frequently used in the logic circuit or the like. On the other hand, FETs including a charge storage film in the gate insulating film may be used in the non-volatile memory. The charge storage film has a trap level, and carriers are trapped (stored) in the trap level. Thereby, information is stored using a phenomenon in which the threshold voltage of the FET changes. The carriers trapped in the trap level are held even when the supply of power to a circuit is removed, and thus the FET functions as a non-volatile memory. As the charge storage film, a silicon nitride ($Si_3N_4$) film is frequently used, and is formed of a three-layer structure interposed in a potential barrier film, between a gate electrode and a channel. As the potential barrier film, a silicon oxide ($SiO_2$) film is frequently used, and the film of the three-layer structure is called an ONO (Oxide/Nitride/Oxide) film. Such a FET is called a MONOS (Metal/Oxide/Nitride/Oxide/Semiconductor) type FET from the structure. In a manufacturing method for an LSI having the non-volatile memory combined therein, a gate insulating film of a normal FET and an ONO film are required to be formed on the same semiconductor substrate.

SUMMARY

In an embodiment, a manufacturing method for a semiconductor device including a non-volatile memory FET and a first breakdown voltage MOSFET is described. The method includes: (b) a step of forming a groove having a predetermined depth in a region on a semiconductor substrate having the first breakdown voltage MOSFET formed therein; (c) a step of forming a first oxide film within the groove through thermal oxidation after the step (b); (e) a step of forming a first gate electrode film on the first oxide film after the step (c); (i) a step of exposing a semiconductor surface of the semiconductor substrate in a region having the non-volatile memory FET formed therein after the step (e); (m) a step of forming a charge storage three-layer film by sequentially depositing a first potential barrier film, a charge storage film, and a second potential barrier film after the step (i); and (n) a step of forming a second gate electrode film on the charge storage three-layer film after the step (m).

DETAILED DESCRIPTION

Introduction

Figure 1:
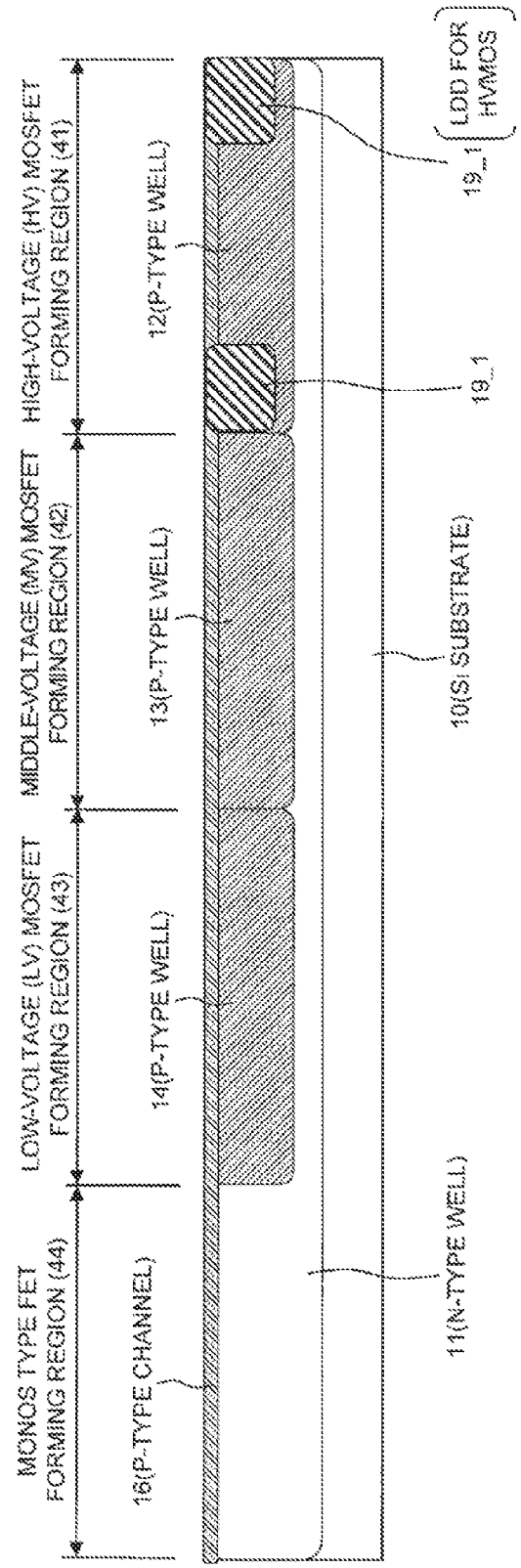
FIG. 1 is a schematic cross-sectional view illustrating a semiconductor device in the course of a manufacturing method (after steps of forming an N-type well, P-type wells, a P-type channel, and an LDD for a high-voltage (HV) MOSFET) according to a first embodiment.

In a manufacturing method of forming multiple types of MOSFETs and MONOS type FETs ranging from a low-voltage to a high-voltage on the same semiconductor substrate, in case that a thermal oxide film having a large thickness is formed in order to form a high-voltage MOSFET, the characteristics of films formed before then are changed, which can impact reliability thereof. It can be understood that, when an ONO film of a MONOS type FET and a poly-silicon film that is a gate electrode film are first formed on the entire surface on the semiconductor substrate, when a region in which a MOSFET is formed is opened thereafter, and when a thick gate oxide film of a high-voltage MOSFET is formed by thermal oxidation, there is a concern that a defect may occur in the ONO film that is formed in advance, impacting reliability.

An aspect of the present disclosure relates to preventing a charge storage three-layer film for a non-volatile memory FET from receiving heat stress due to thermal oxidation for forming a gate oxide film of a high-voltage MOSFET and to improve reliability, in a manufacturing method for a semiconductor device including a non-volatile memory FET and high-voltage and low-voltage MOSFETs.

Techniques for solving such a problem will be described below, but other problems and novel features will be apparent from the following description and accompanying drawings of the specification.

According to an embodiment, a configuration is as follows. A manufacturing method for a semiconductor device including a non-volatile memory FET and high-voltage and low-voltage MOSFETs includes the following steps. A groove having a predetermined depth is formed in a region in which the high-voltage MOSFET on a semiconductor substrate is formed, and an oxide film serving as a gate insulating film of the high-voltage MOSFET is formed within the formed groove by thermal oxidation. Thereafter, a gate electrode film of the low-voltage MOSFET is formed on the entire surface of the semiconductor substrate. Thereafter, a region having the non-volatile memory FET formed therein is opened, the semiconductor surface of the semiconductor substrate is exposed, and a first potential barrier film, a charge storage film, and a second potential barrier film are sequentially deposited, to thereby form a charge storage three-layer film. A gate electrode film of the non-volatile memory FET is formed on the formed charge storage three-layer film.

A brief description of an effect obtained by the embodiment is as follows. The charge storage three-layer film does not receive heat stress due to thermal oxidation for forming a gate oxide film of a high-voltage MOSFET, and thus it is possible to suppress a deterioration in reliability. Particularly, even in case that the charge storage three-layer film is an ONO film, the occurrence of a defect in the film is suppressed, and reliability is not impaired.

1. Summary of the Embodiments

First, summary of representative embodiments of the invention disclosed in the application will be described. Reference numerals in drawings in parentheses referred to in description of the summary of the representative embodiments just denote components included in the concept of the components to which the reference numerals are designated.

[1] Formation of Charge Storage Film after Thermal Oxidation of Gate Oxide Film of High-Voltage MOSFET A manufacturing method for a semiconductor device (1) including a non-volatile memory FET (54) and a first breakdown voltage MOSFET (51) includes:

(b) a step of forming a groove having a predetermined depth in a region (41) having the first breakdown voltage MOSFET on a semiconductor substrate (10) formed therein;

(c) a step of forming a first oxide film (26) within the groove through thermal oxidation after the step (b);

(e) a step of forming a first gate electrode film (31) on the first oxide film after the step (c);

(i) a step of exposing a semiconductor surface of the semiconductor substrate in a region (44) having the non-volatile memory FET formed therein, after the step (e);

(m) a step of forming a charge storage three-layer film (20) by sequentially depositing a first potential barrier film (21), a charge storage film (22), and a second potential barrier film (23) after the step (i); and (n) a step of forming a third gate electrode film (33) on the charge storage three-layer film after the step (m);

Thereby, the charge storage three-layer film does not receive heat stress due to thermal oxidation for forming a gate oxide film of a high-voltage MOSFET, and thus it is possible to suppress a deterioration in reliability.

[2] ONO Film

In the manufacturing method for a semiconductor device according to paragraph 1, the first potential barrier film (21) and the second potential barrier film (23) are silicon oxide films, and the charge storage film (22) is a silicon nitride film or a silicon oxynitride film.

Thereby, the charge storage three-layer film (20) can be formed of an ONO film.

[3] A Plurality of MOSFETs Having Different Breakdown Voltages

In the manufacturing method for a semiconductor device according to paragraphs 1 or 2, the semiconductor device further includes a second breakdown voltage MOSFET (52), the method further including the following step:

(d) a step of forming a second oxide film (25) through thermal oxidation after the step (c) and before the step (e).

Thereby, it is possible to enhance the reliability of the semiconductor device, and to improve a yield rate. Since the heights of the first oxide film (26) and the second oxide film (25) can be made substantially uniform by appropriately setting the depth of the groove according to paragraph 1, the stepped difference of the semiconductor substrate surface before a wiring step is reduced, and thus it is possible to improve the yield rate of a wiring.

[4] Formation of Well for MONOS Type FET

The manufacturing method for a semiconductor device according to any one of paragraphs 1 to 3 further includes the following steps:

(a) a step of forming a resist film having an opening in the region having the first breakdown voltage MOSFET on the semiconductor substrate formed therein, through lithography before the step (b), and forming a first well (12) within the semiconductor substrate through ion implantation; and (j) a step of forming a third well (15) in the region (44) having the non-volatile memory FET formed therein, through ion implantation, after the step (i) and before the step (m).

Thereby, it is possible to form the well (third well, 15) of the non-volatile memory FET through ion implantation, using the opening formed by the step (i), and to reduce the number of lithography processes as compared to a case where the well of the non-volatile memory FET (54) is formed before the step (b), similarly to the step (a) of forming well regions of normal MOSFETs (51 to 53) of a first breakdown voltage or a second breakdown voltage.

[5] Removal of Resist Before Formation of Channel for MONOS Type FET

In the manufacturing method for a semiconductor device according to paragraph 4, the step (i) is a step of forming a first resist film (92) having an opening in the region (44) having the non-volatile memory FET formed therein, and exposing the semiconductor surface of the semiconductor substrate through etching, the method further including the following steps:

(k) a step of removing the first resist film after the step (j) and before the step (m); and (l) a step of implanting impurity ions into a shallower region within the semiconductor substrate than that in the ion implantation of the step (j), after the step (k) and before the step (m).

Thereby, it is possible to suppress the characteristic variation of the MONOS type FET (54). The mechanism thereof will be described in detail in a second embodiment.

[6] Channel Ion Implantation from Both Oblique Directions

The manufacturing method for a semiconductor device according to any one of paragraphs 1 to 3 further includes the following steps:

(f1) a step of forming a CMP stopper film (29) on the first gate electrode film after the step (e);

(f2) a step of forming an element isolation groove in an element isolation region (30) that isolates a plurality of the non-volatile memory FETs and a plurality of the first breakdown voltage MOSFETs from each other, after the step (f1);

(f3) a step of burying the element isolation groove after the step (f2), and further forming an insulating film on the entire surface of the semiconductor substrate;

(f4) a step of polishing the surface of the semiconductor substrate until the CMP stopper film is exposed, through chemical mechanical polishing (CMP), after the step (f3);

(f5) a step of selectively removing the CMP stopper film after the step (f4) and before the step (i);

(j) a step of forming a third well (15) in the region having the non-volatile memory FET formed therein, through ion implantation, after the step (i); and (l) a step of implanting impurity ions in shallower regions (16, 17) within the semiconductor substrate than that in the ion implantation of the step (j), after the step (j) and before the step (m), the ion implantation of the step (l) including a step of implanting impurity ions from a direction which is substantially perpendicular to a direction of a channel length (L) of the non-volatile memory FET (54) formed in the opening formed by the step (i) and is inclined at a predetermined first angle ($\theta 1$) from a direction perpendicular to the surface of the semiconductor substrate, and a step of implanting impurity ions from a direction which is substantially perpendicular to the direction of the channel length and is inclined at a predetermined second angle ($\theta 2$) reverse to the first angle from a direction perpendicular to the surface of the semiconductor substrate.

Thereby, it is possible to improve the write margin of the non-volatile memory. The steps (f1) to (f5) are steps of forming STI (Shallow Trench Isolation) for element isolation. The STI insulating layer (30) is formed higher than the surface of the semiconductor layer of the semiconductor substrate (10) by these steps. The MONOS type FET (54) constituting the non-volatile memory is formed in a region surrounded by the STI, a gate electrode (64) is formed from one STI across the other STI in the direction of a channel width (W), and a source region and a drain region are formed with the gate electrode interposed therebetween. On the other hand, channel ion implantation from both oblique directions which are described in detail in a fourth embodiment stated later is performed, and thus, in the vicinity of the sidewall of the STI shaded by the STI insulating layer which is formed higher than the surface of the semiconductor layer of the semiconductor substrate, a dose can be reduced further than the central portion thereof. Thereby, it is possible to adjust the amount of impurities implanted into each of an inside current channel away from the sidewall of the STI and a current channel on both sides formed along the vicinity of the sidewall, and thus the write margin of the non-volatile memory is improved.

[7] Selective Etching for Maintaining STI Stepped Difference

In the manufacturing method for a semiconductor device according to paragraph 6, the first gate electrode film is a polysilicon film, and the insulating film in the step (f3) is a silicon oxide film, and the step (i) includes an etching step in which an etching rate for polysilicon is higher than an etching rate for the silicon oxide film.

Thereby, it is possible to reduce an amount of a stepped difference in which the STI insulating layer is formed higher than the surface of the semiconductor layer of the semiconductor substrate being cut undesirably in the step (i), through the steps (f1) to (f5), and to stably form the size of a shaded region in both-oblique-direction ion implantation according to paragraph 6.

[8] Angle≈45° of Both-Oblique-Direction Ion Implantation

In the manufacturing method for a semiconductor device according to paragraph 6, the first angle ($\theta 1$) and the second angle ($\theta 2$) are generally 45° ($\theta 1 \approx -\theta 2 \approx 45°$).

Thereby, in the both-oblique-direction channel ion implantation according to paragraph 6, it is possible to stably control the size of the shaded region without undesirably reduce a range.

[9] Prevention of Oxidation of First Gate Electrode Film

In the manufacturing method for a semiconductor device according to any one of paragraphs 1 to 3, the first gate electrode film is a polysilicon film to which impurities are added, and the first potential barrier film is a silicon oxide film, the method further including the following step:

(h) a step of forming an anti-oxidation film (34) on the first potential barrier film after the step (e) and before the step (i).

Thereby, it is possible to suppress a variation in the threshold voltage of a second breakdown voltage MOSFET (for example, low-voltage (LV) MOSFET 53) on the P channel side. The mechanism thereof will be described in detail in a third embodiment stated later.

[10] Anti-oxidation Film Is Silicon Nitride Film

In the manufacturing method for a semiconductor device according to paragraph 9, the anti-oxidation film is a silicon nitride film.

Thereby, in case that an ONO film is formed using the charge storage film as a silicon nitride film, the ONO film and the anti-oxidation film which is a silicon nitride film can be removed by the same etching step in a subsequent step.

[11] Anti-Oxidation Film in Case that First Gate Electrode Film is Two-layer Polysilicon In the manufacturing method for a semiconductor device according to any one of paragraphs 1 to 3, the first gate electrode film is a polysilicon film to which impurities are added, and the first potential barrier film is a silicon oxide film, the method further including the following steps:

(f1) a step of forming a CMP stopper film (29) on the first gate electrode film after the step (e);

(f2) a step of forming an element isolation groove in an element isolation region (30) that isolates a plurality of the non-volatile memory FETs and a plurality of the first breakdown voltage MOSFETs from each other, after the step (f1);

(f3) a step of burying the element isolation groove after the step (f2), and further forming an insulating film on the entire surface of the semiconductor substrate;

(f4) a step of polishing the surface of the semiconductor substrate until the CMP stopper film is exposed, through chemical mechanical polishing (CMP), after the step (f3);

(f5) a step of selectively removing the CMP stopper film after the step (f4);

(g) a step of forming a polysilicon film (32) to which impurities are added, on the entire surface of the semiconductor substrate, after the step (f5); and (h) a step of forming an anti-oxidation film (34) on the polysilicon film (32), after the step (g) and before the step (i).

Thereby, even in case that a gate electrode of so-called two-layer polysilicon is adopted in which the polysilicon film (32) located above the first gate electrode film is further formed after the formation of the STI, the anti-oxidation film (34) is formed similarly to paragraph 9, and thus it is possible to suppress a variation in the threshold voltage of the second breakdown voltage MOSFET (for example, low-voltage (LV) MOSFET 53) on the P channel side.

[12] Anti-Oxidation Film+Both-Oblique-Direction Ion Implantation in Case that First Gate Electrode Film is Two-Layer Polysilicon The manufacturing method for a semiconductor device according to paragraph 11 further includes the following steps:

(j) a step of forming a third well in the region having the non-volatile memory FET formed therein, through ion implantation, after the step (i); and (l) a step of implanting impurity ions in a shallower region within the semiconductor substrate than that in the ion implantation of the step (j), after the step (j) and before the step (m), the ion implantation of the step (l) including a step of implanting impurity ions from a direction which is substantially perpendicular to a direction of a channel length of the non-volatile memory FET formed in the opening formed by the step (i) and is inclined at a predetermined first angle ($\theta 1$) from a direction perpendicular to the surface of the semiconductor substrate, and a step of implanting impurity ions from a direction which is substantially perpendicular to the direction of the channel length and is inclined at a predetermined second angle ($\theta 2$) reverse to the first angle from a direction perpendicular to the surface of the semiconductor substrate.

Thereby, it is possible to further add a both-oblique-direction ion implantation step similar to paragraph 6, and to improve the write margin of the non-volatile memory.

[13] Reduction in Thickness of Gate Electrode Film of MONOS Type FET

In the manufacturing method for a semiconductor device according to any one of paragraphs 1 to 12, the third gate electrode film is thinner than the first gate electrode film.

Thereby, in a lithography process for performing patterning of the gate electrodes (61 to 63) of the MOSFETs (51 to 53) subsequent thereto, it is possible to reduce the occurrence of a problem of the gate electrode (64) of the MONOS type FET (54) being damaged by etching. The thickness of the third gate electrode film (33) is equivalent to the height of the gate electrode (64) of the MONOS type FET (54). In case that the height is large, a problem occurs in that there may be a concern that the thickness of the resist film (94) formed by the above lithography becomes smaller in the gate electrode and is lost in the course of etching for patterning, and the gate electrode film (33) which has to remain as the gate electrode (64) is exposed to etching due to the exposure thereof and suffers etching damage.

[14] Prevention of Etching Damage to Gate Electrode of MONOS Type FET

The manufacturing method for a semiconductor device according to paragraph 13 further includes the following steps:

(o) a step of patterning a gate electrode (64) of the non-volatile memory FET after the step (n);

(p) a step of forming a resist film (94) in the region (44) for the non-volatile memory FET and a region having a gate electrode (61) of the first breakdown voltage MOSFET formed therein, through lithography, after the step (o);

(q) a step of etching the first gate electrode film which is not covered with the resist film formed in the step (p), after the step (p), a value of a product of S/L and H/L being specified in case that a line of the gate electrode (64) of the non-volatile memory FET (54) is set to L, a space thereof is set to S, and a height thereof is set to H so that a thickness of the resist film (94), formed in the step (p), on the gate electrode (64) of the non-volatile memory FET is set to a thickness which is not lost by the etching step of the step (q).

Thereby, it is possible to suppress etching damage to the gate electrode (64) of the MONOS type FET (54) in the etching step of patterning the gate electrode (63) of the MOSFET (53). The mechanism thereof will be described in detail in a fifth embodiment stated later.

2. Further Detailed Description of the Embodiments

A further detailed description of the embodiments will be given.

First Embodiment

A manufacturing method for a semiconductor device 1 including a MONOS type FET 54, having a charge storage film within a gate insulating film, for constituting a non-volatile memory, and three types of MOSFETs 51 to 53 of a high-voltage, a middle-voltage, and a low-voltage for constituting a logic circuit, a memory circuit, an analog circuit and the like will be described with reference to FIGS. 1 to 20.

FIG. 1 is a schematic cross-sectional view illustrating the semiconductor device 1 in the course of a manufacturing method (after steps of forming an N-type well 11, P-type wells 12 to 14, a P-type channel 16, and an LDD 19_1 for a high-voltage (HV) MOSFET) according to a first embodiment. In the drawing, a MONOS type FET forming region 44, a low-voltage (LV: Low Voltage) MOSFET forming region 43, a middle-voltage (MV) MOSFET forming region 42, and a high-voltage (HV) MOSFET forming region 41 are illustrated. Only a step of forming an N-channel FET is shown in each region. However, a step of forming a semiconductor region of a reverse conductivity type is added, and thus a P-channel FET may be formed so as to be configured as a CMOS (Complementally Metal Oxide Semiconductor) FET. In addition, only the P-channel FET may be formed.

First, donor impurities, such as phosphorus (P) or arsenic (As), are introduced by ion implantation from the surface of a semiconductor substrate 10 (hereinafter, simply called the substrate 10) such as, for example, P-type silicon, to thereby form the N-type well 11. Next, openings of a resist film are sequentially formed in the respective regions 41 to 44 using a lithography technique, and acceptor impurities such as boron (B) are introduced into a region shallower than the N-type well 11 by ion implantation, to thereby sequentially form the P-type wells 12 to 14 in the formed openings. In case that a P-channel FET is further formed (not shown), an N-type well is further formed within the N-type well 11 or the P-type wells 12 to 14.

Next, the P-type channel 16 is formed by ion implantation in the vicinity of the entire surface of the substrate 10. In ion implantation for adjusting the impurity concentration of a channel region of an N-channel FET to be formed, the threshold voltage of the N-channel FET is adjusted. Here, the entire surface of the substrate 10 means the entire surface of a region in which an N-channel FET is formed. In case that a region having a P-channel FET formed therein is present, channel regions are sequentially formed in the respective regions using a lithography technique.

Next, the lightly doped drain (LDD) 19_1 is formed within a HVMOSFET forming region 41. The LDD 19 for an HVMOS can be formed as a lateral diffusion region for improving a drain breakdown voltage by alleviating an electric field between the drain and the gate of the HVMOSFET 51. The lateral diffusion region to be formed is opened using a lithography technique, and acceptor impurities such as boron (B) are introduced, for example, from the surface of the substrate 10 by ion implantation.

Figure 2:
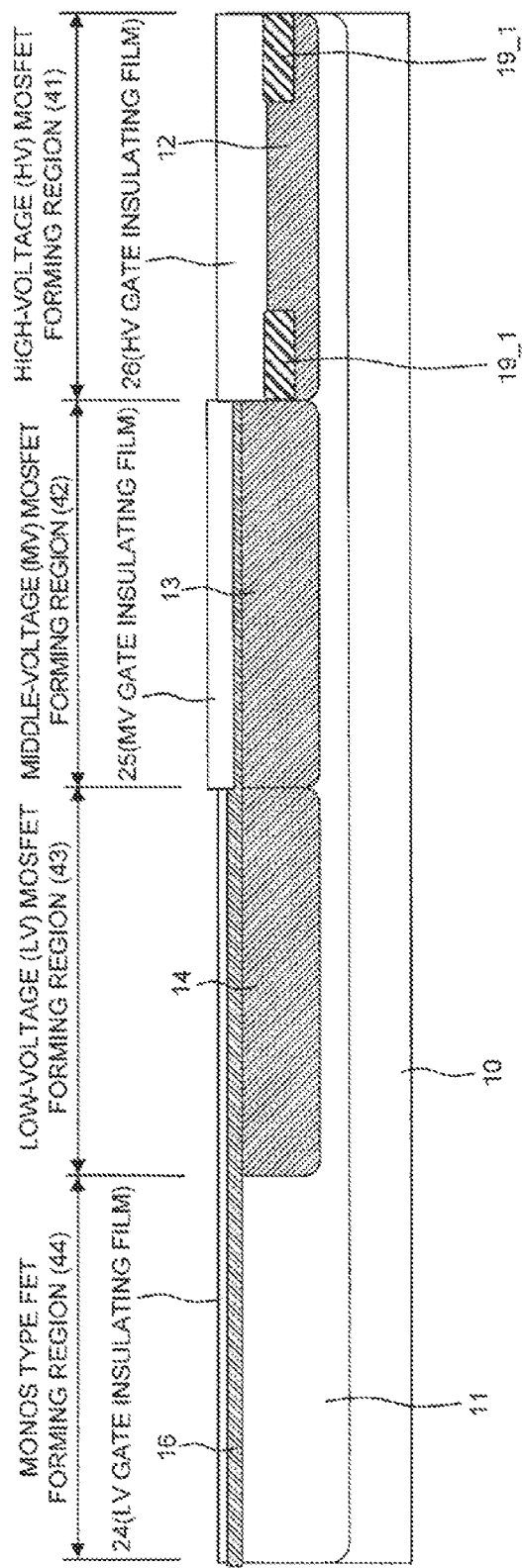
FIG. 2 is a schematic cross-sectional view illustrating the semiconductor device in the course of a manufacturing method (after a step of forming gate insulating films) according to the first embodiment.

FIG. 2 is a schematic cross-sectional view illustrating the semiconductor device 1 after a step of forming gate insulating films 24 to 26 subsequent to the above-mentioned step. A groove having a predetermined depth is formed in the HVMOSFET forming region 41 on the substrate 10, and the gate insulating film 26 for the HVMOSFET 51 is formed in the groove by thermal oxidation. Next, the gate insulating film 25 for the MVMOSFET 52 is formed in the MVMOSFET forming region 42 by thermal oxidation. Next, the gate insulating film 24 for the LVMOSFET 53 is formed in the LVMOSFET forming region 43 by thermal oxidation. In this case, the gate insulating film 24 is also formed in the MONOS type FET forming region 44, but this film is removed by a step described later. For example, in order to thermally oxidize only a desired region of the silicon substrate, a silicon nitride film having an opening in the region is formed and is used as a hard mask, and a thermal oxidation step of oxidizing the crystal surface of the substrate exposed to the opening is performed. The thicknesses of the respective gate insulating films 26, 25, and 24 are set so as to satisfy the gate breakdown voltage of the MOSFETs 51, 52, and 53 having the respective breakdown voltages. The gate insulating film 26 of the HVMOSFET 51 can be formed thicker than the other gate insulating films 25 and 24 for the purpose of a high breakdown voltage. The depth of the groove formed in the substrate 10 before the substrate is thermally oxidized is finally set so that the heights of the respective gate insulating films 26, 25, and 24 are uniform. Although omitted in the above description, a groove may also be formed in the MVMOSFET forming region 42 in advance before the thermal oxidation step. Thereby, it is possible to make the heights of the gate insulating films 24 to 26 uniform, which improves the yield rate of a wiring due to the stepped difference of the substrate 10 before a subsequent wiring step being reduced. As used herein, "make heights uniform" does not mean setting to exactly the same height. As the stepped difference becomes smaller, a defect density generated in the subsequent wiring step is reduced, and the yield rate improves.

Figure 3:
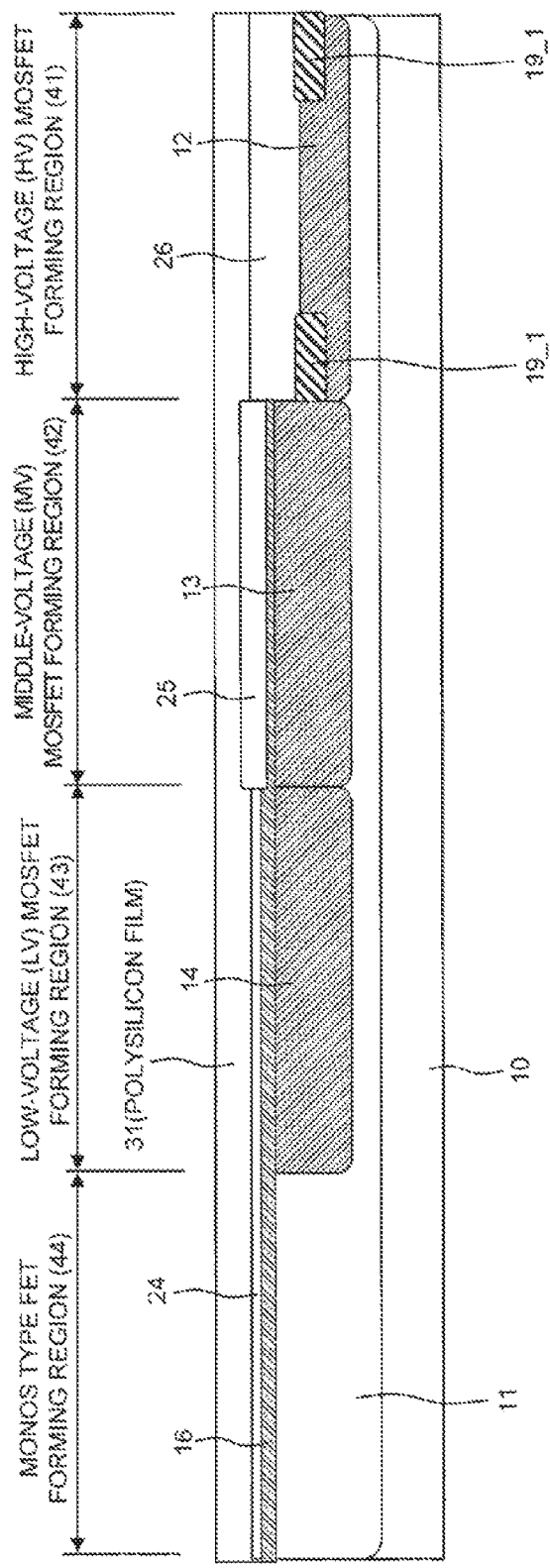
FIG. 3 is a schematic cross-sectional view illustrating the semiconductor device in the course of a manufacturing method (after a step of forming a first gate electrode film) according to the first embodiment.

FIG. 3 is a schematic cross-sectional view illustrating the semiconductor device 1 after a step of forming a gate electrode film 31 subsequent to the above-mentioned step. A polysilicon film is deposited on the surface of the semiconductor device 1 shown in FIG. 2, for example, by a CVD (Chemical Vapor Deposition) method, to thereby form the gate electrode film 31. The polysilicon film is doped with impurities such as, for example, boron (B) or phosphorus (P) at a high concentration, and thus electric conductivity is lowered. Such impurity doping may be simultaneously performed in a CVD process of depositing the polysilicon film, and the impurities may be introduced by ion implantation or the like after film formation.

Figure 4:
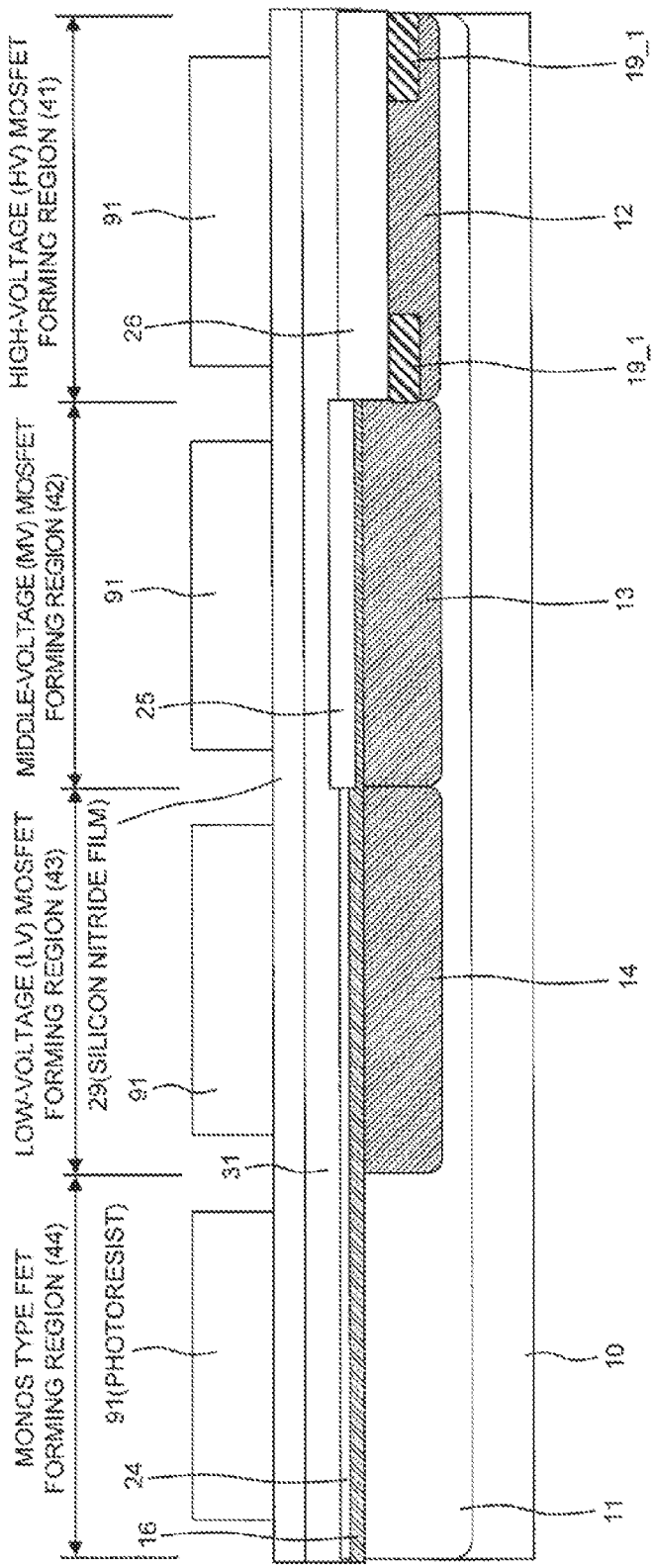
FIG. 4 is a schematic cross-sectional view illustrating the semiconductor device in the course of a manufacturing method (after a step of forming a CMP (Chemical Mechanical Polish) stopper film, and a lithography process for forming an element isolation region) according to the first embodiment.

FIG. 4 is a schematic cross-sectional view illustrating the semiconductor device 1 after a step of forming a CMP stopper film 29 subsequent to the above-mentioned step and a lithography process for forming an element isolation region 30. The silicon nitride film 29 is deposited on the surface of the semiconductor device 1 shown in FIG. 3, for example, by a CVD method. The silicon nitride film 29 functions as a stopper in a subsequent CMP step. Next, a resist 91 having an opening in the element isolation region 30 is formed by lithography.

Figure 5:
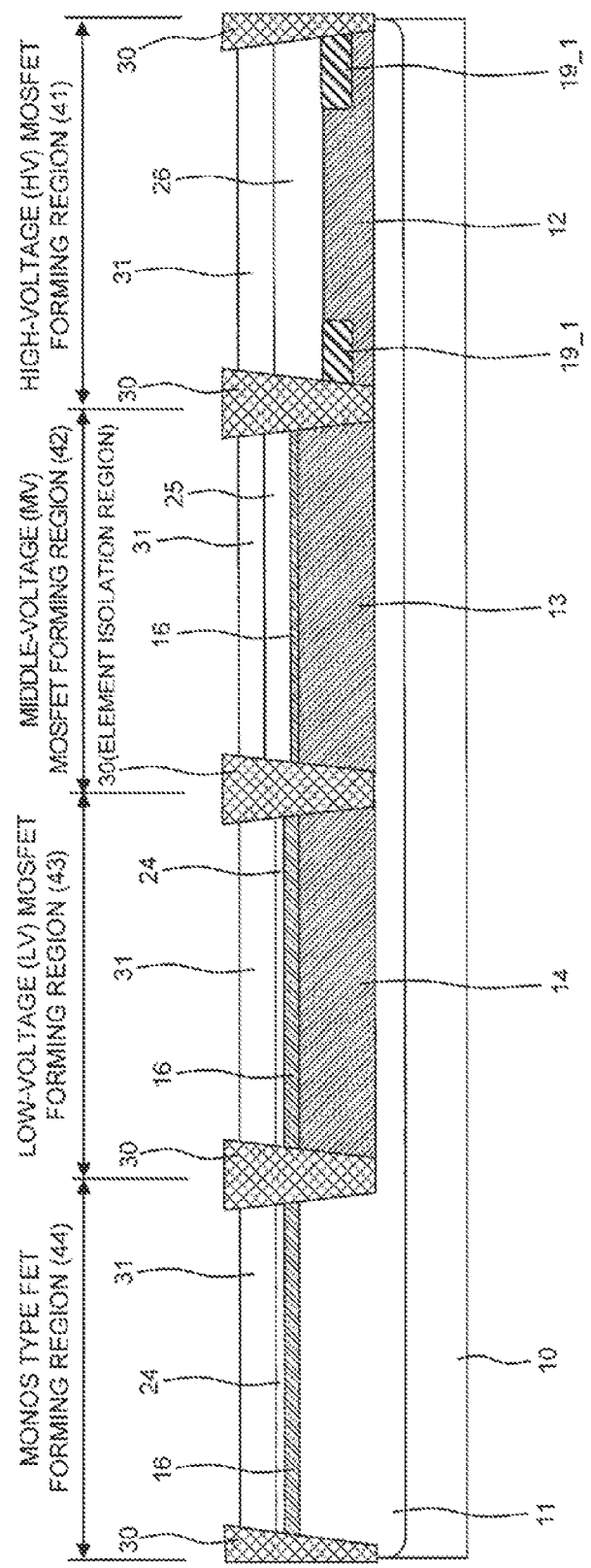
FIG. 5 is a schematic cross-sectional view illustrating the semiconductor device in the course of a manufacturing method (after a step of forming the element isolation region) according to the first embodiment.

FIG. 5 is a schematic cross-sectional view illustrating the semiconductor device 1 after a step of forming the element isolation region 30 subsequent to the above-mentioned step. Anisotropic dry etching, for example, is performed on the semiconductor device 1 shown in FIG. 4, and thus a groove (trench) extending in the depth direction of the substrate 10 is formed in the opening of the resist 91. The groove is formed up to a position deeper than the wells 12 to 14. Next, after the resist 91 is removed, a silicon oxide film is deposited, for example, by a CVD method to bury the formed groove. In this case, the silicon oxide film is also deposited on the entire surface of the surface of the semiconductor device 1 other than the groove. Next, the surface of the semiconductor device 1 is polished by chemical mechanical polishing (CMP) until the silicon nitride film 29 is exposed. In this manner, the silicon nitride film 29 functions as a stopper film in the CMP. Next, the silicon nitride film 29 providing a stopper is removed by etching. This etching is high-selectivity etching having a high etching rate for the silicon nitride film 29, and a low etching rate for the silicon oxide film formed in the element isolation region 30 and the polysilicon film 31 located below the silicon nitride film 29. The STI 30 is formed in the element isolation region by the above steps. The elements of a plurality of elements formed within the respective transistor forming regions 41 to 44 are isolated from each other by the STI 30.

Figure 6:
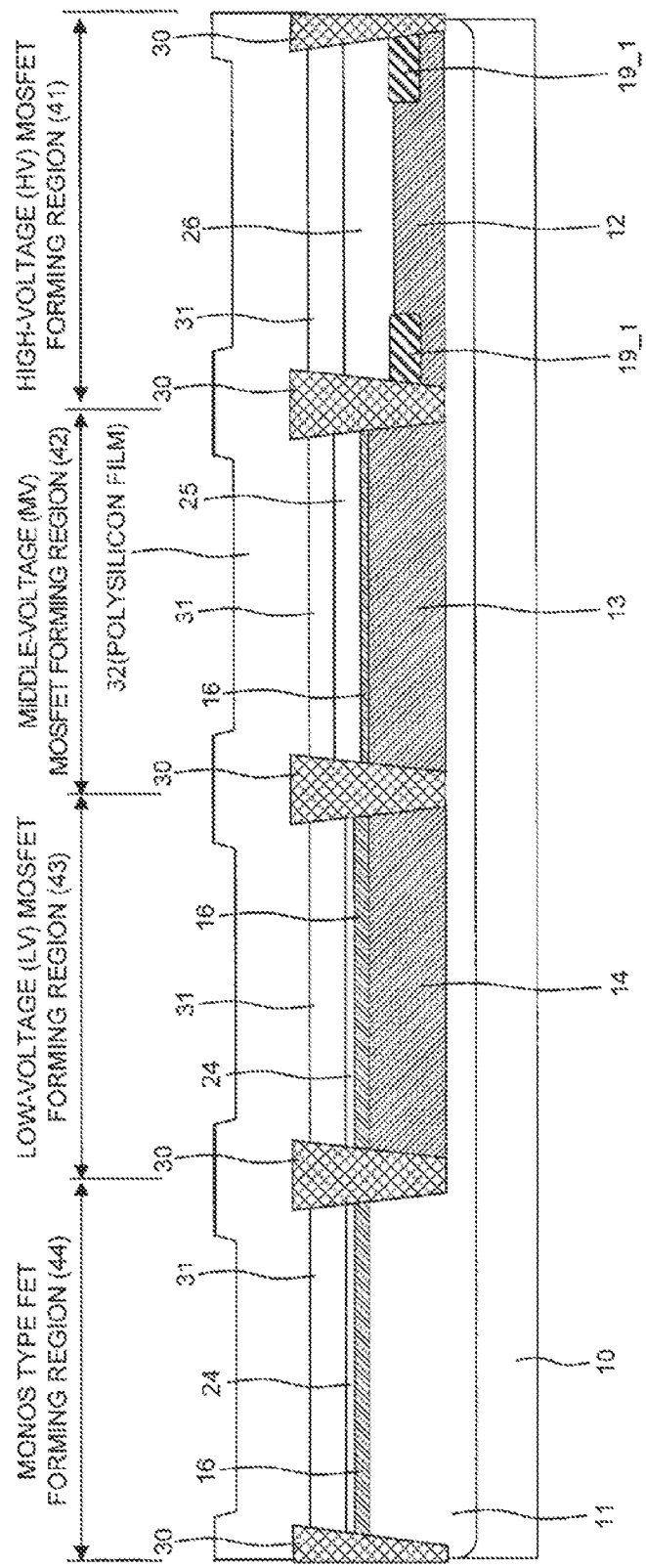
FIG. 6 is a schematic cross-sectional view illustrating the semiconductor device in the course of a manufacturing method (after a step of forming a second gate electrode film) according to the first embodiment.

FIG. 6 is a schematic cross-sectional view illustrating the semiconductor device 1 after a step of forming a gate electrode film 32 subsequent to the above-mentioned step. A polysilicon film is deposited on the surface of the semiconductor device 1 shown in FIG. 5, for example, by a CVD method, and is doped with impurities such as phosphorus (P) at a high concentration to achieve a reduction in resistance, thereby allowing the gate electrode film 32 to be formed. The gate electrode film 32 is formed to cover not only the gate electrode film 31 formed in advance, but also the STI 30, and functions as a wiring to a gate electrode in an inactive region located on the STI 30.

Figure 7:
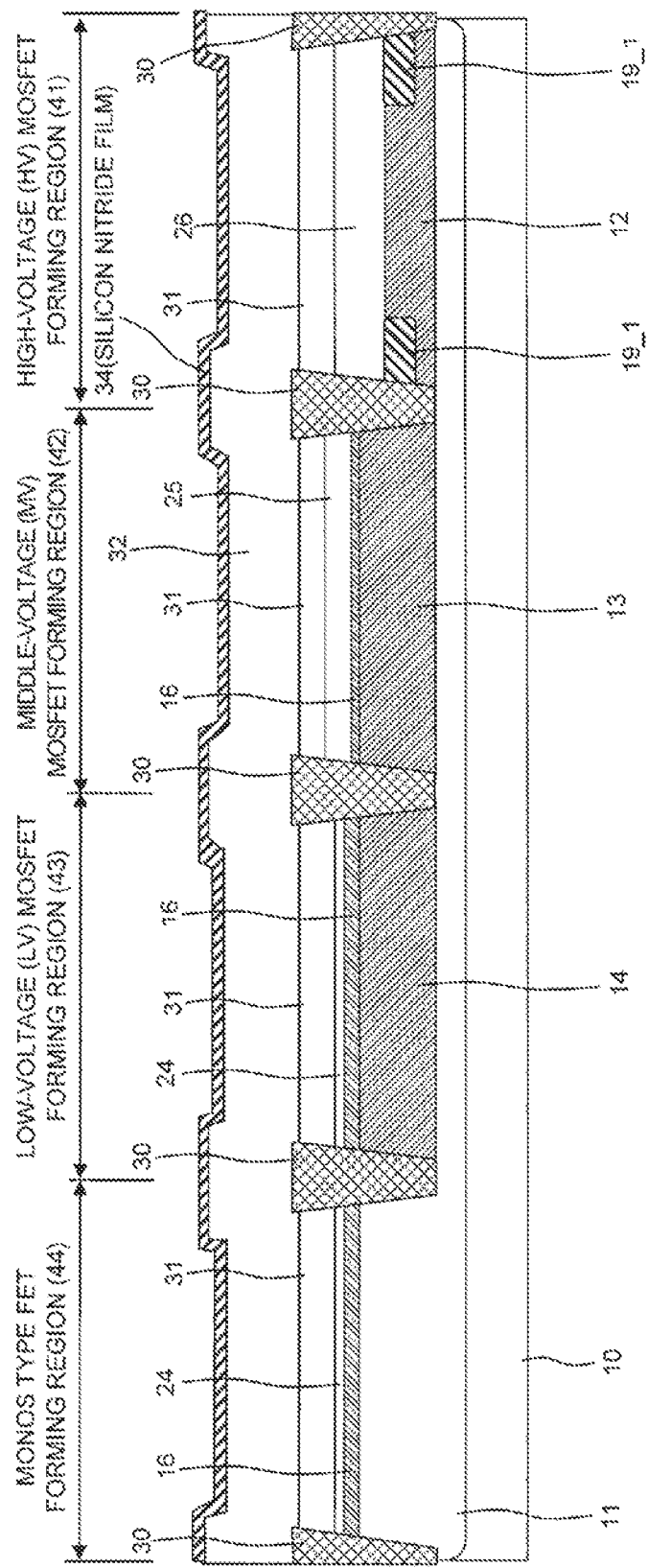
FIG. 7 is a schematic cross-sectional view illustrating the semiconductor device in the course of a manufacturing method (after a step of forming an anti-oxidation film) according to the first embodiment.

FIG. 7 is a schematic cross-sectional view illustrating the semiconductor device 1 after a step of forming an anti-oxidation film 34 subsequent to the above-mentioned step. The silicon nitride film 34 is formed on the surface of the semiconductor device 1 shown in FIG. 6, that is, on the gate electrode film 32, for example, by a CVD method. This silicon nitride film 34 functions as an anti-oxidation film 34 that prevents the gate electrode film 32 from being oxidized in a subsequent step of forming a silicon oxide film.

Figure 8:
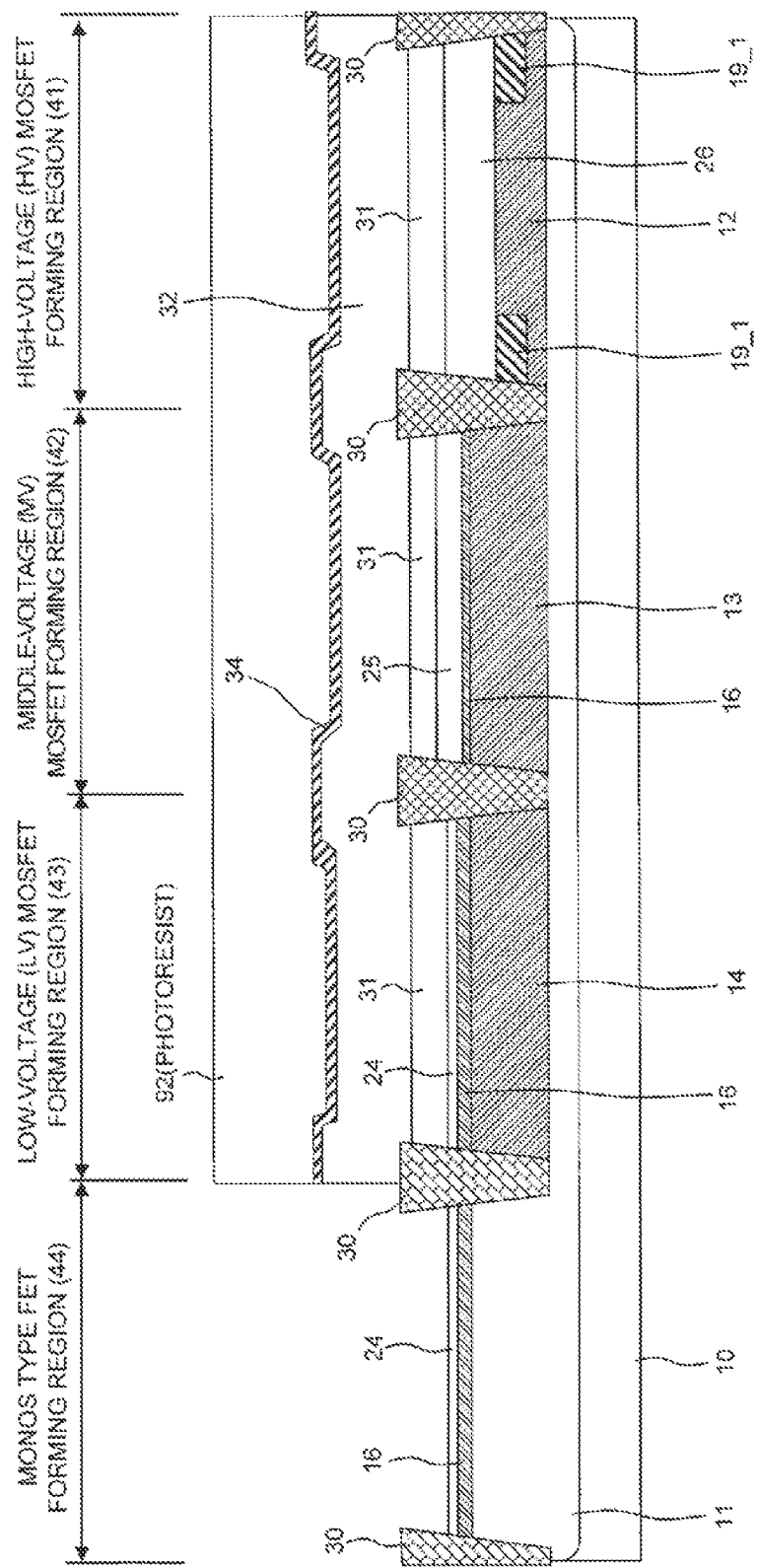
FIG. 8 is a schematic cross-sectional view illustrating the semiconductor device in the course of a manufacturing method (after a lithography process for opening a non-volatile memory region) according to the first embodiment.

FIG. 8 is a schematic cross-sectional view illustrating the semiconductor device 1 after a lithography process for opening the non-volatile memory region (MONOS type FET forming region) 44 subsequent to the above-mentioned step. A resist is applied onto the surface of the semiconductor device 1 shown in FIG. 7, that is, on the anti-oxidation film 34, and the non-volatile memory MONOS type FET forming region 44 is opened by lithography. The anti-oxidation film 34 and the gate electrode films 32 and 31 are removed by etching, using a resist 92 having an opening in the MONOS type FET forming region 44 as a mask. This etching may be high-selectivity etching having a high etching rate for the anti-oxidation film 34 and the gate electrode films 32 and 31, that is, the silicon nitride film and polysilicon, and a low etching rate for the silicon oxide film formed in the element isolation region 30.

Figure 9:
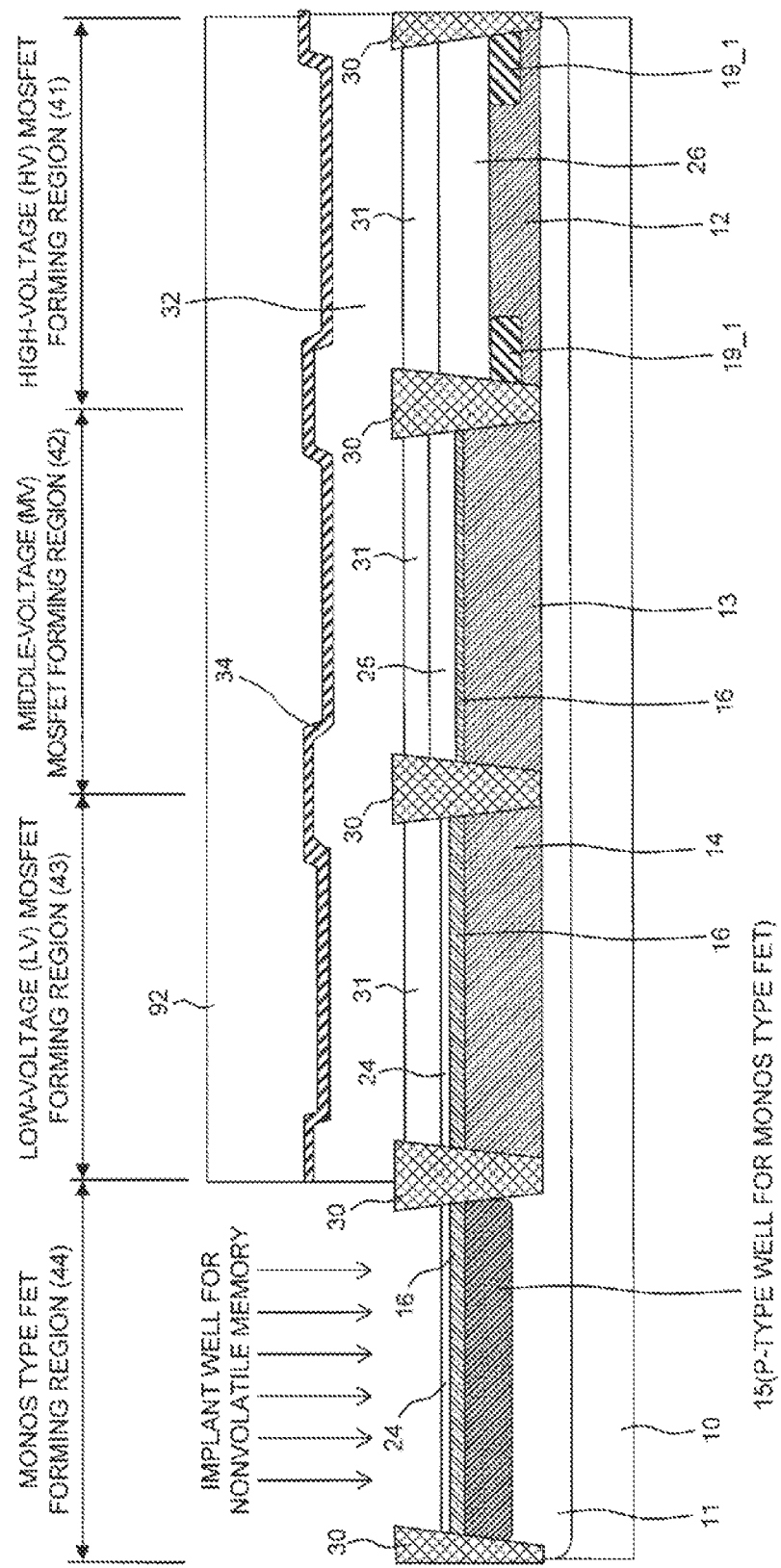
FIG. 9 is a schematic cross-sectional view illustrating the semiconductor device in the course of a manufacturing method (after a step of forming a well for a MONOS type FET) according to the first embodiment.

FIG. 9 is a schematic cross-sectional view illustrating the semiconductor device 1 after a step of forming a well 15 for the MONOS type FET 54 subsequent to the above-mentioned step. Acceptor impurities, such as boron (B), are introduced from the surface of the semiconductor device 1 shown in FIG. 8 by ion implantation (well ion implantation), and thus the P-type well 15 for the MONOS type FET 54 is formed within the substrate 10 of the MONOS type FET forming region 44 in which the resist 92 is opened.

Figure 10:
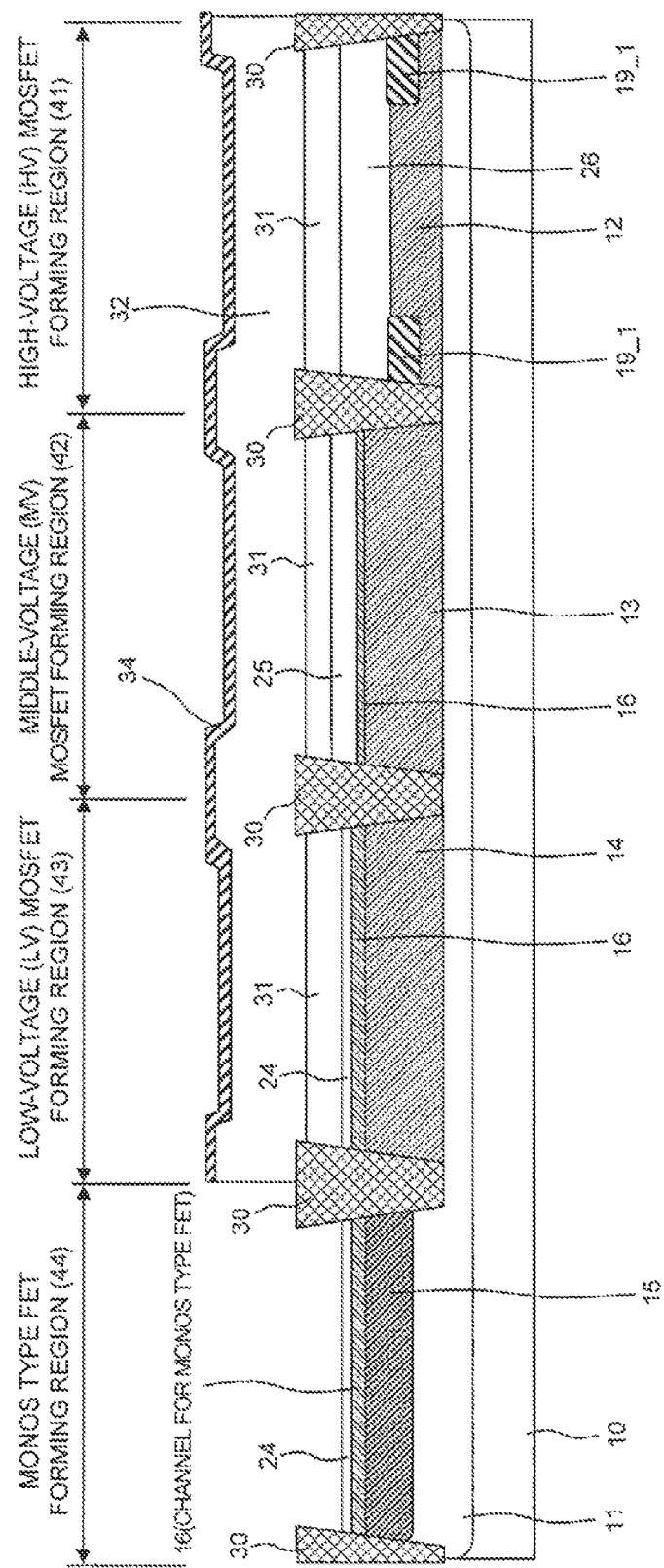
FIG. 10 is a schematic cross-sectional view illustrating the semiconductor device in the course of a manufacturing method (after a channel ion implantation step of forming a channel for the MONOS type FET) according to the first embodiment.

FIG. 10 is a schematic cross-sectional view illustrating the semiconductor device 1 after a channel ion implantation step of forming the channel 16 for the MONOS type FET 54 subsequent to the above-mentioned step. After the resist 92 is removed from the surface of the semiconductor device 1 shown in FIG. 8, impurities are introduced by ion implantation, and thus the channel region 16 for the MONOS type FET 54 is formed in the vicinity of the surface of the MONOS type FET forming region 44 within the substrate 10. The impurity concentration of the channel region is adjusted by this ion implantation (channel ion implantation), and the threshold voltage of the MONOS type FET 54 is adjusted. The resist 92 may be removed after the well ion implantation and before the channel ion implantation. Because the resist 92 not only serves as the anti-oxidation film 34 and an etching mask of the gate electrode 32, but also serves as a mask of the well ion implantation, a thick resist can be used. In case that the thick resist 92 is removed, this is because organic foreign matter is attached to the surface of the substrate 10 of the MONOS type FET forming region 44 which is an opening, and scattered ions are prevented from being implanted into the substrate 10 in the ion implantation. In the well ion implantation, acceleration energy is high. However, in the channel ion implantation, acceleration energy is low. The low acceleration energy leads to a serious influence on element characteristics to such a large extent that ions are prevented from being implanted into the substrate 10. For this reason, the resist 92 may be removed after the well ion implantation before the channel ion implantation. In a cleaning step (asking step) of removing the resist 92, foreign matter attached to the surface of the substrate 10 of the MONOS type FET forming region 44 is also cleaned off and removed, and thus ions are not prevented from infiltrating into the channel ion implantation.

Figure 11:
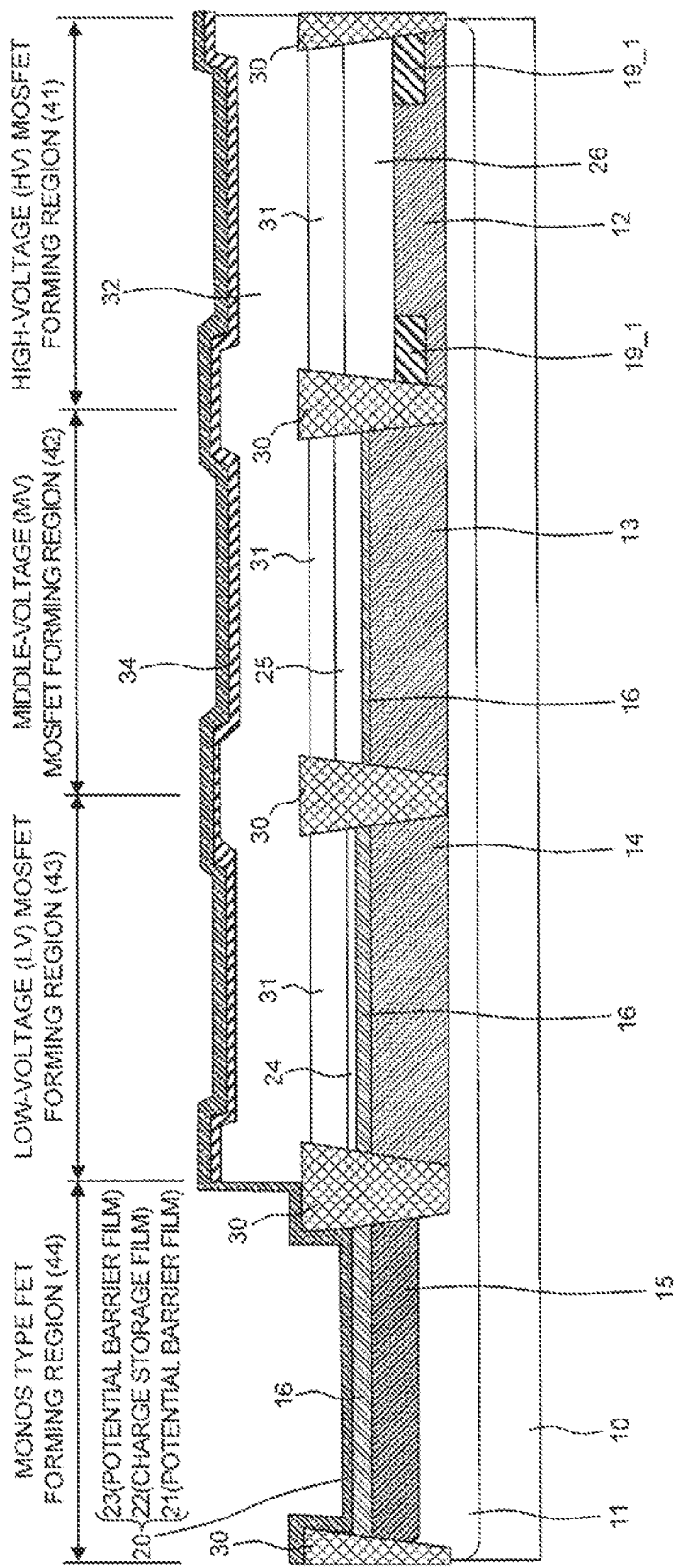
FIG. 11 is a schematic cross-sectional view illustrating the semiconductor device in the course of a manufacturing method (after a step of forming a charge storage three-layer film for the MONOS type FET (potential barrier film, charge storage film, and potential barrier film)) according to the first embodiment.

FIG. 11 is a schematic cross-sectional view illustrating the semiconductor device 1 after a step of forming a charge storage three-layer film 20 for the MONOS type FET 54 (potential barrier film 21, charge storage film 22, and potential barrier film 23) subsequent to the above-mentioned step. The gate insulating film 24 is removed by etching from the MONOS type FET forming region 44 of the semiconductor device 1 shown in FIG. 10, and the potential barrier film 21, the charge storage film 22, and the potential barrier film 23 are sequentially formed on the surface of the semiconductor device 1. The potential barrier film 21 and the potential barrier film 23 are, for example, silicon oxide films, and the charge storage film 22 is, for example, a silicon nitride film. These films are formed by a CVD method. In this case, the charge storage three-layer film 20 is an ONO film. The charge storage film 22 may be a material, having a trap level, which traps carriers, and may be a silicon oxynitride film (SiON) in addition to a silicon nitride film (SiN, $Si_3N_4$). Further, a conductive film such as polysilicon may be used. However, in case that a conductive charge storage film is adopted, the film can be formed as a high-quality insulating film having no defects in the potential barrier film in order to suppress the leakage of charge that is stored.

In the MOSFET forming regions 41 to 43, in case that the silicon oxide film that is the potential barrier film 21 is deposited by a CVD method in a step of depositing the potential barrier film 21 on the gate electrode film 32, the formation of the anti-oxidation film 34 in advance prevents oxygen radicals in CVD from infiltrating into polysilicon, which is the gate electrode film 32. Thereby, it is possible to prevent the oxygen radicals in CVD from causing accelerated oxidation of polysilicon in the gate electrode film 31 located further down than the gate electrode film 32.

Figure 12:
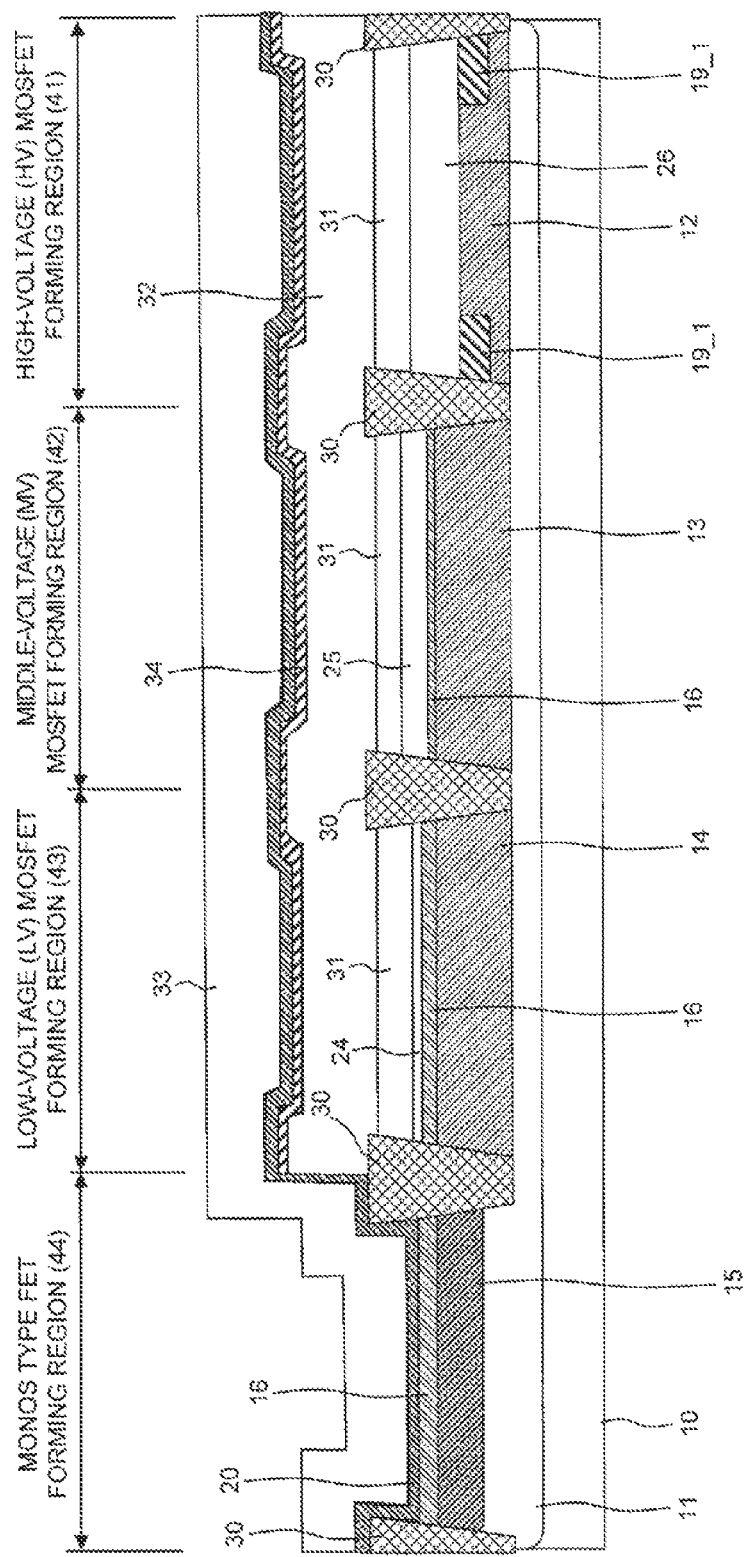
FIG. 12 is a schematic cross-sectional view illustrating the semiconductor device in the course of a manufacturing method (after a step of forming a third gate electrode film) according to the first embodiment.

FIG. 12 is a schematic cross-sectional view illustrating the semiconductor device 1 after a step of forming a gate electrode film 33 subsequent to the above-mentioned step. A polysilicon film is deposited on the surface of the semiconductor device 1 shown in FIG. 11, for example, by a CVD method, and is doped with impurities such as phosphorus (P) at a high concentration to achieve a reduction in resistance, thereby allowing the gate electrode film 33 to be formed. The gate electrode film 33 serves as a gate electrode 64 of the MONOS type FET 54.

Figure 13:
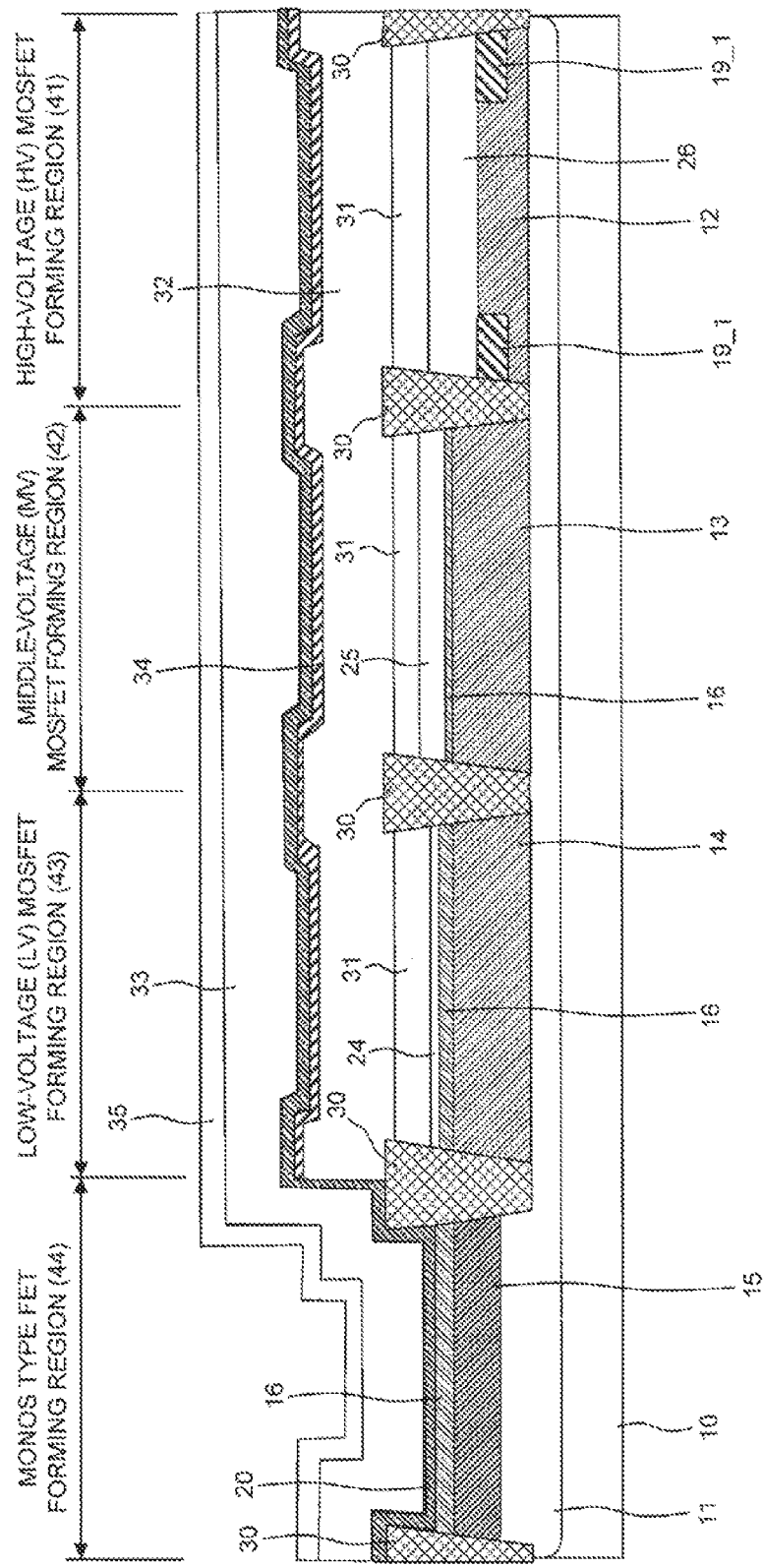
FIG. 13 is a schematic cross-sectional view illustrating the semiconductor device in the course of a manufacturing method (after a step of forming a silicon oxide film) according to the first embodiment.

FIG. 13 is a schematic cross-sectional view illustrating the semiconductor device 1 after a step of forming a silicon oxide film 35 subsequent to the above-mentioned step. The silicon oxide film 35 is formed on the surface of the semiconductor device 1 shown in FIG. 12, for example, by a CVD method. In case that the thickness of a resist film located on the gate electrode 64 of the MONOS type FET 54 becomes excessively thin in a subsequent step described with reference to FIG. 18, the silicon oxide film 35 protects the gate electrode.

Figure 14:
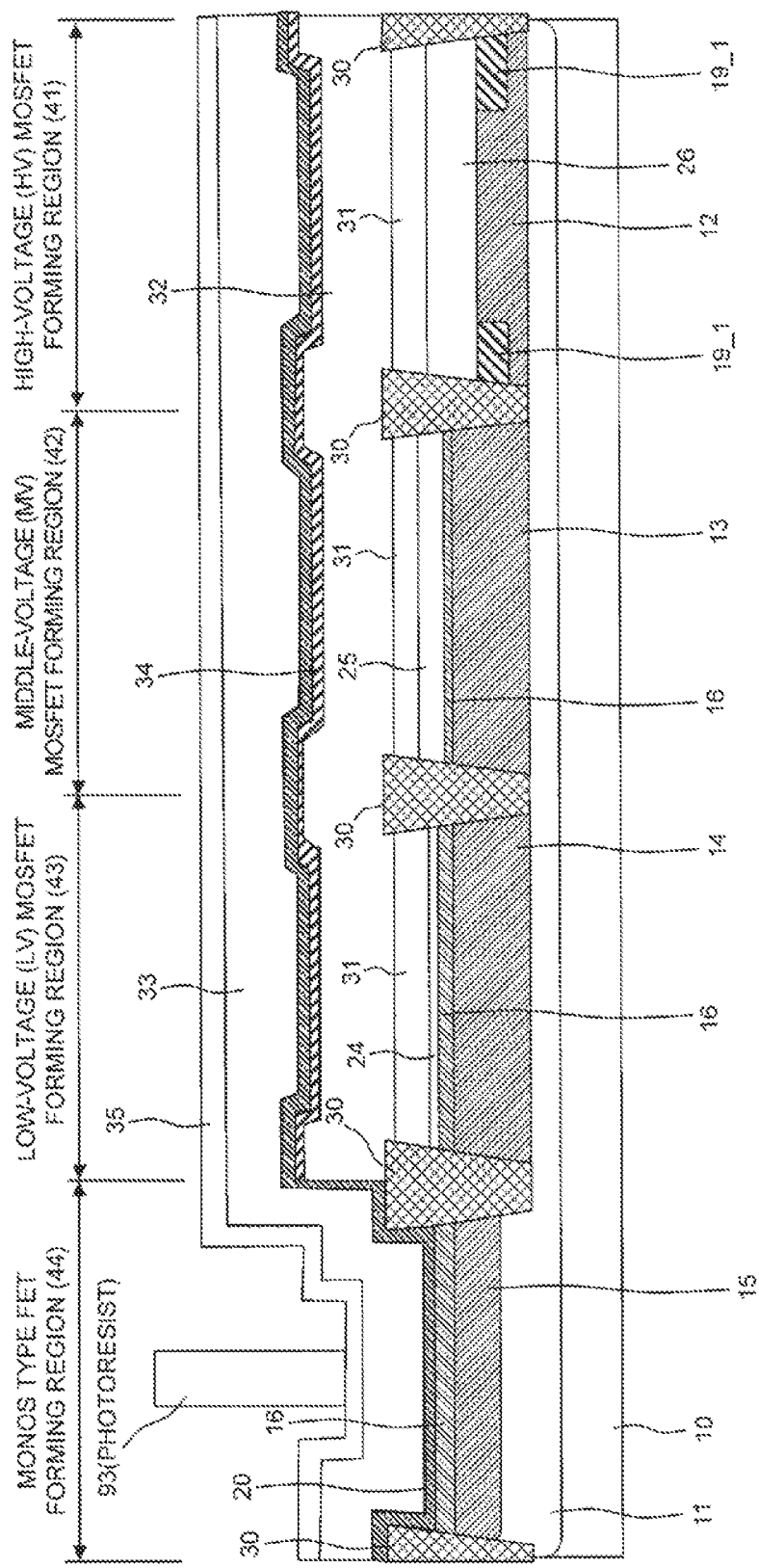
FIG. 14 is a schematic cross-sectional view illustrating the semiconductor device in the course of a manufacturing method (after a lithography process for patterning a gate electrode for the MONOS type FET) according to the first embodiment.

FIG. 14 is a schematic cross-sectional view illustrating the semiconductor device 1 after a lithography process for patterning the gate electrode 64 for the MONOS type FET 54 subsequent to the above-mentioned step. A resist 93 is formed, using lithography, in a portion in which the gate electrode 64 for the MONOS type FET 54 is formed, and a portion in which a wiring located on the same layer as the gate electrode 64 is formed.

Figure 15:
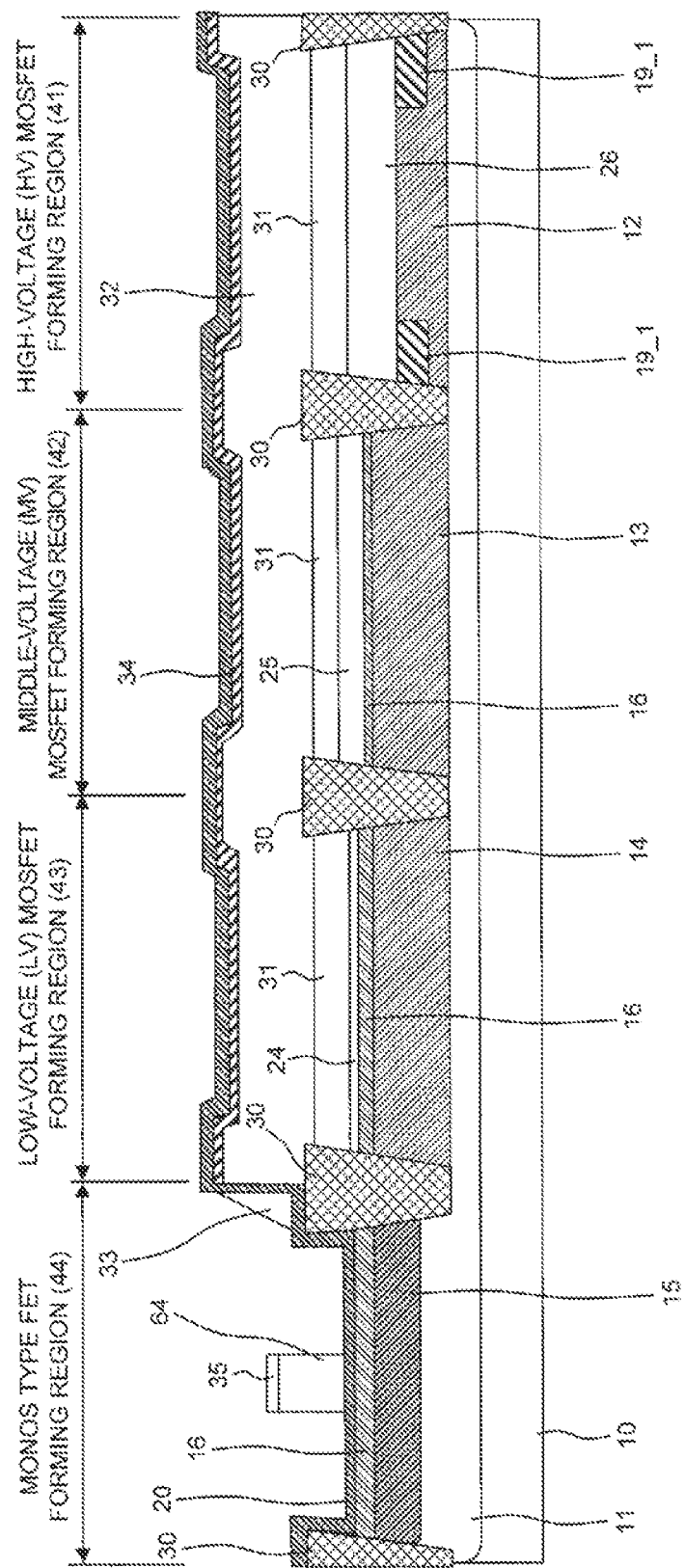
FIG. 15 is a schematic cross-sectional view illustrating the semiconductor device in the course of a manufacturing method (after a step of etching the third gate electrode layer in order to pattern the gate electrode for the MONOS type FET) according to the first embodiment.

FIG. 15 is a schematic cross-sectional view illustrating the semiconductor device 1 after a step of etching the gate electrode layer 33 for patterning the gate electrode 64 for the MONOS type FET 54 subsequent to the above-mentioned step. The silicon oxide film 35 and the gate electrode layer 33 are removed by etching, using the resist 93 formed in the above-mentioned step as a mask. After etching, the resist 93 is also cleaned off and removed. In this case, the gate electrode 64 is constituted by two layers of the gate electrode layer 33 and the silicon oxide film 35.

Figure 16:
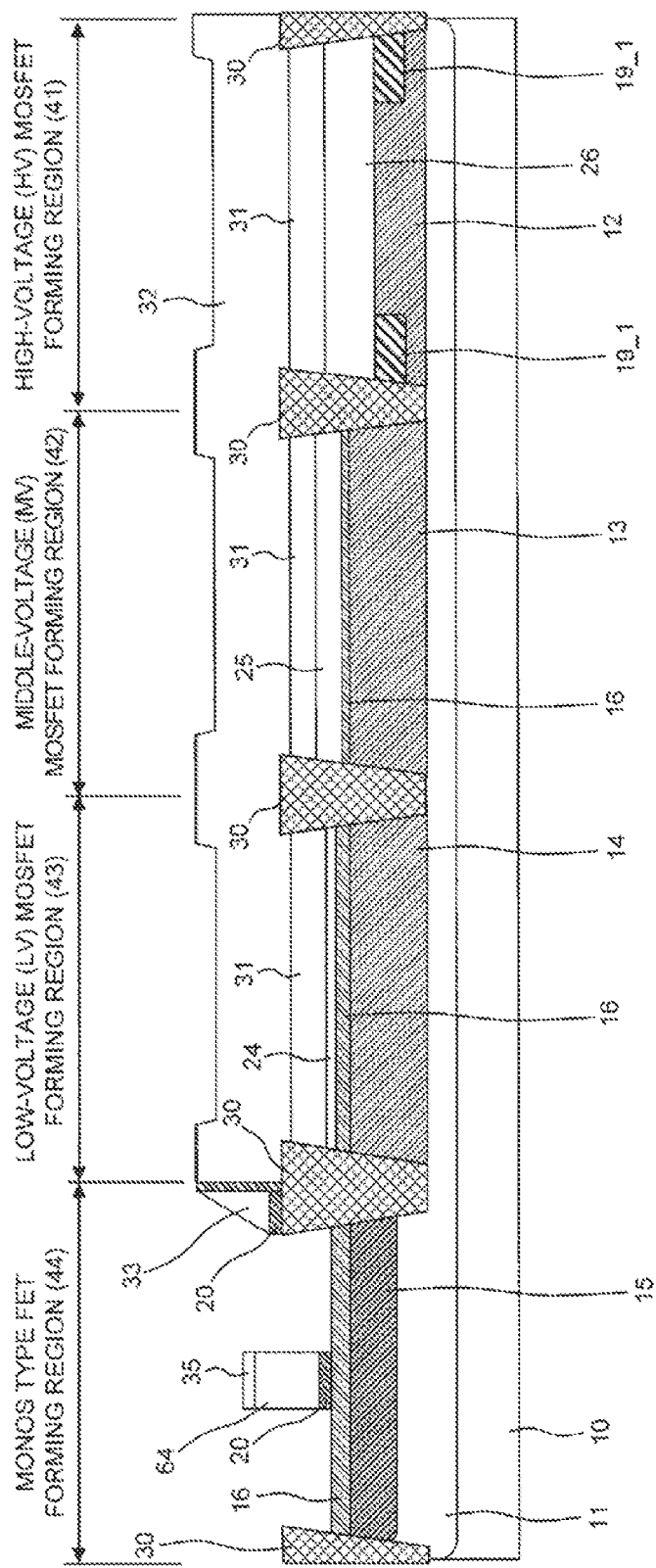
FIG. 16 is a schematic cross-sectional view illustrating the semiconductor device in the course of a manufacturing method (after a step of etching the charge storage three-layer film and the anti-oxidation film in order to pattern the gate electrode for the MONOS type FET) according to the first embodiment.

FIG. 16 is a schematic cross-sectional view illustrating the semiconductor device 1 after a step of etching the charge storage three-layer film 20 and the anti-oxidation film 34 for patterning the gate electrode 64 for the MONOS type FET 54 subsequent to the above-mentioned step. Using the gate electrode 64 patterned in the above-mentioned step as a hard mask, the ONO film that is the charge storage three-layer film 20 and the silicon nitride film that is the anti-oxidation film 34 formed thereunder in the MOSFET forming regions 41 to 43 are removed by etching. The silicon oxide film 35 formed on the gate electrode layer 33 in the gate electrode 64 functions as a protective film that prevents the gate electrode layer 33 from being damaged by this etching step.

Figure 17:
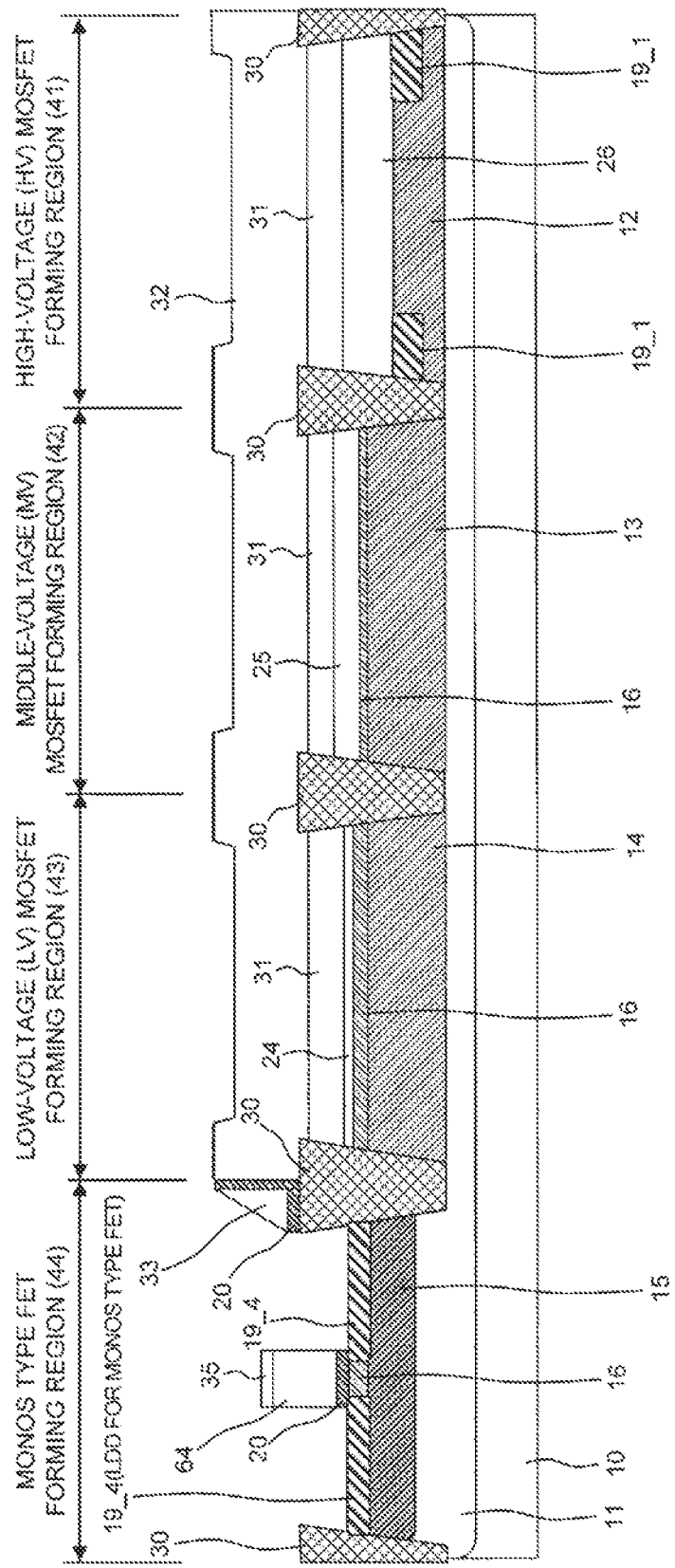
FIG. 17 is a schematic cross-sectional view illustrating the semiconductor device in the course of a manufacturing method (after a step of forming a lightly doped drain for the MONOS type FET) according to the first embodiment.

FIG. 17 is a schematic cross-sectional view illustrating the semiconductor device 1 after a step of forming a lightly doped drain 19_4 for the MONOS type FET 54 subsequent to the above-mentioned step. The lightly doped drain (LDD) 19_4 for MONOS type FET 54 is formed by ion implantation of donor impurities such as, for example, phosphorus (P) or arsenic (As). In this ion implantation step, the gate electrode 64 also functions as a hard mask, and the LDD 19_4 is self-aligned on both sides of the gate electrode 64, and serves as a channel region of the MONOS type FET 54 just below the gate electrode 64.

Figure 18:
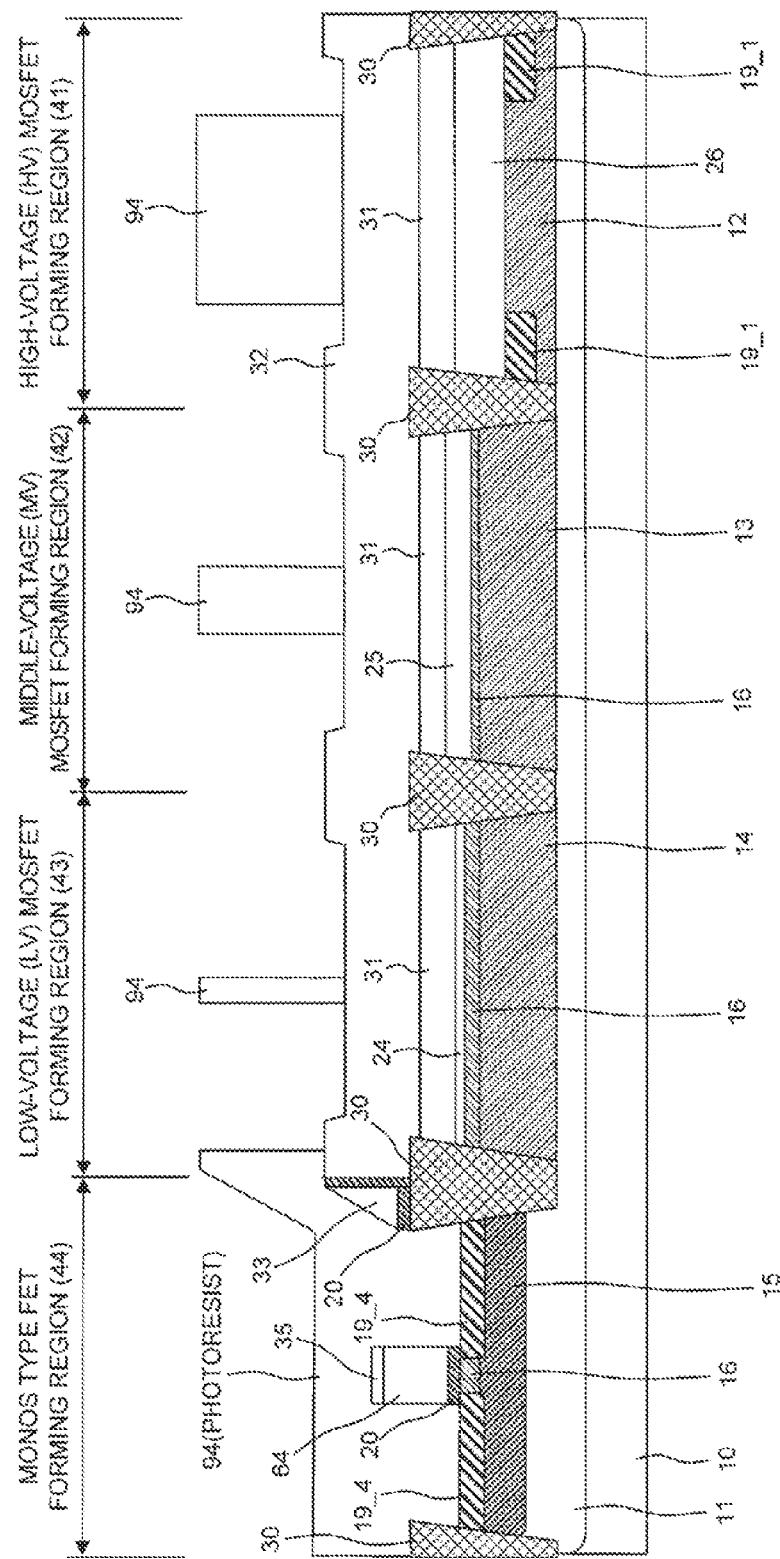
FIG. 18 is a schematic cross-sectional view illustrating the semiconductor device in the course of a manufacturing method (after a lithography process for patterning gate electrodes for a MOSFET) according to the first embodiment.

FIG. 18 is a schematic cross-sectional view illustrating the semiconductor device 1 after a lithography process for patterning gate electrodes 61 to 63 for a MOSFET subsequent to the above-mentioned step. A resist 94 is formed, using lithography, in portions in which the gate electrodes 61 to 63 for the MOSFETs 51 to 53 are formed, and a portion in which a wiring located on the same layer as the gate electrodes 61 to 63 is formed.

Figure 19:
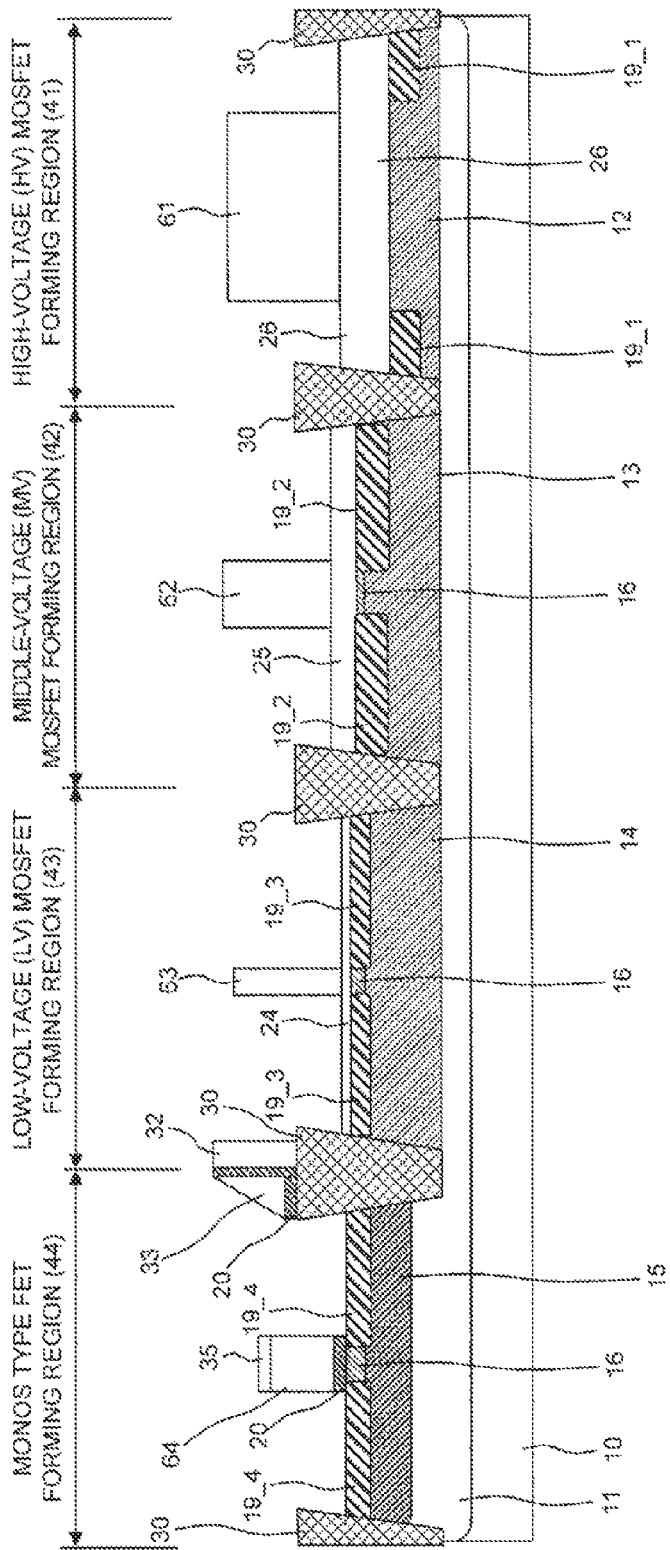
FIG. 19 is a schematic cross-sectional view illustrating the semiconductor device in the course of a manufacturing method (after an etching step of forming the gate electrodes for a MOSFET and a step of forming lightly doped drains) according to the first embodiment.

FIG. 19 is a schematic cross-sectional view illustrating the semiconductor device 1 after an etching step of forming the gate electrodes 61 to 63 for a MOSFET and a step of forming lightly doped drains (LDDs) 19_1 to 19_3 subsequent to the above-mentioned step. The gate electrode layers 31 and 32 are removed by etching using the resist 94 formed in the above-mentioned step as a mask. After etching, the resist 94 is also cleaned off and removed. Next, the LDD 19_3 of the LVMOSFET 53 and the LDD 19_2 of the MVMOSFET 52 are formed by ion implantation of donor impurities such as, for example, phosphorus (P) or arsenic (As). In this ion implantation step, each of the gate electrodes 63 and 62 functions as a hard mask, the LDD 19_3 is self-aligned on both sides of the gate electrode 63 and serves as a channel region of the LVMOSFET 53 just below the gate electrode 63, and the LDD 19_2 is self-aligned on both sides of the gate electrode 62 and serves as a channel region of the MVMOSFET 52 just below the gate electrode 62.

Figure 20:
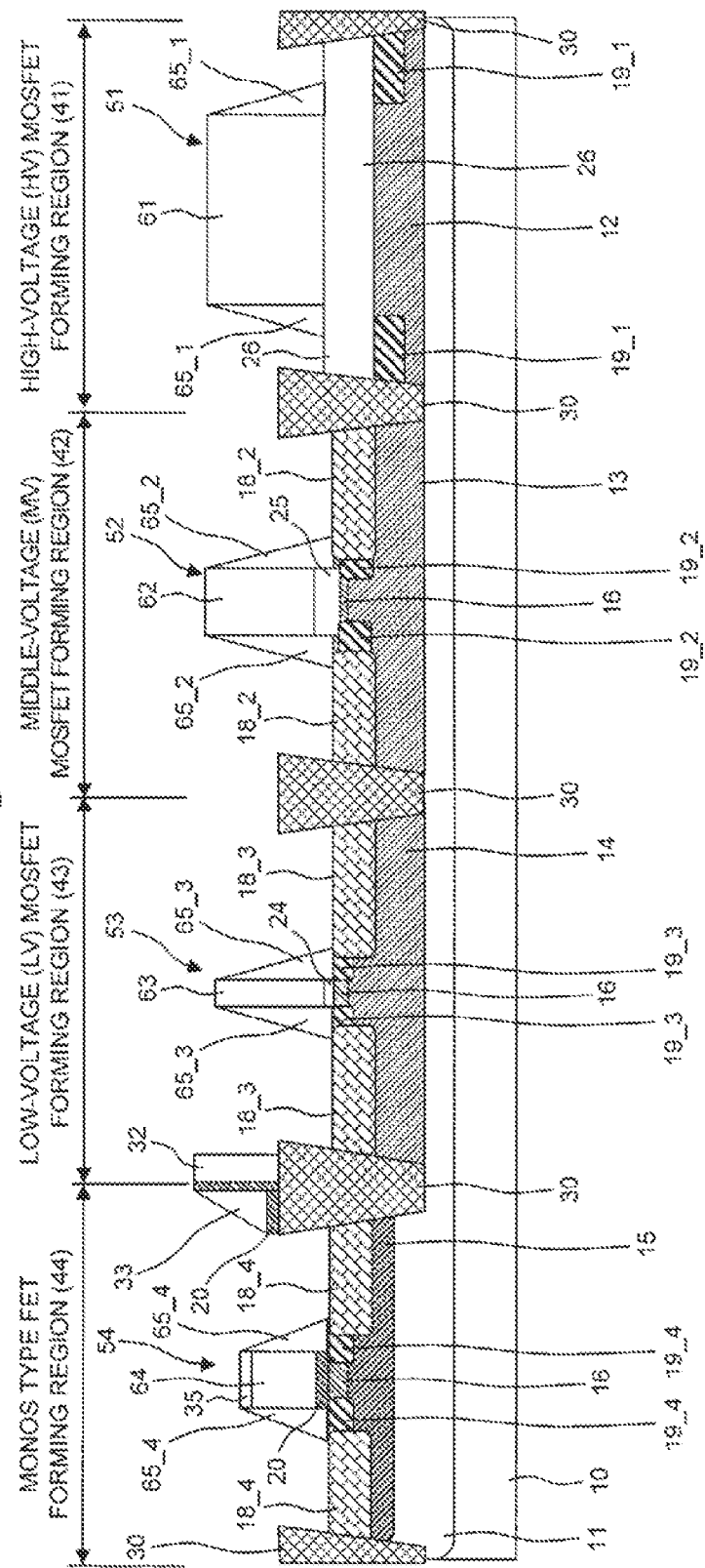
FIG. 20 is a schematic cross-sectional view illustrating the semiconductor device in the course of a manufacturing method (after a step of forming gate sidewall insulating films (sidewalls) and a step of forming source and drain regions) according to the first embodiment.

FIG. 20 is a schematic cross-sectional view illustrating the semiconductor device 1 after a step of forming gate sidewall insulating films (sidewalls) 65_1 to 65_4 and a step of forming source and drain regions 18_1 to 18_4 subsequent to the above-mentioned step. Each of the gate sidewall insulating films (sidewalls) 65_1 to 65_4 is formed on both sides of the gate electrodes 61 to 63 of the MOSFETs 51 to 53 and the gate electrode 64 of the MONOS type FET 54 that are formed in the above-mentioned steps. The gate sidewall insulating films 65_1 to 65_4 can be formed by isotropically depositing a silicon oxide film using, for example, a CVD method, and performing anisotropic etching in a vertical direction from the upper surface of the substrate. Using each of the gate electrodes 62 to 64 and the gate sidewall insulating films 65_2 to 65_4 of the MVMOSFET 52, the LVMOSFET 53, and the MONOS type FET 54 as a hard mask, the source and drain regions 18_2 to 18_4 are formed by performing ion implantation of donor impurities such as, for example, phosphorus (P) or arsenic (As). In the high-voltage HVMOSFET 51, particularly, since the drain is formed separately from the gate, the source and drain region 18_1 is specified and formed by lithography without being self-aligned with respect to the gate sidewall insulating film 65_1.

Thereafter, steps of forming an interlayer insulating film, a contact hole, a wiring and the like can be configured similarly to a well-known manufacturing method for a semiconductor device.

In the first embodiment described above, the lithography process can be a photolithography process in which light is used, and the resist can be a photoresist. In other embodiments, the lithography process may be other lithography processes, including lithography processes of an electron beam or the like. In addition, the ion implantation step is associated with a heat treatment (annealing) step of recovering a crystal state after ion implantation, but the description thereof is omitted. The heat treatment (annealing) step may be performed for each ion implantation, or may be performed collectively one time with respect to several ion implantations.

A technique relating to each characteristic embodiment that is adopted in the manufacturing method for a semiconductor device shown in the first embodiment will be described in more detail.

Second Embodiment

Formation of Charge Storage Film after Thermal Oxidation of Gate Oxide Film of High-Voltage MOSFET In a manufacturing method of forming multiple types of MOSFETs and MONOS type FETs ranging from a low-voltage to a high-voltage on the same semiconductor substrate, in case that a thermal oxide film having a large thickness is formed in order to form a high-voltage MOSFET, the characteristics of films formed before then are changed, and thus there is a concern that the reliability thereof may be impaired. The reason is because, in case that a step is adopted in which an ONO film of a MONOS type FET and a polysilicon film that is a gate electrode film are first formed on the entire surface on the semiconductor substrate, a region in which a MOSFET is formed is opened thereafter, and then a thick gate oxide film of a high-voltage MOSFET is formed by thermal oxidation, a defect may occur in the ONO film which is formed in advance.

In order to solve such a problem, a manufacturing method for a semiconductor device 1 according to a second embodiment is configured as follows.

A groove having a predetermined depth is formed in a region in which a high-voltage MOSFET on a semiconductor substrate is formed (step (b)), and an oxide film serving as a gate insulating film of the high-voltage MOSFET is formed within the formed groove by thermal oxidation (step (c)). For example, as described with reference to FIG. 2, the groove having a predetermined depth is formed in the high-voltage (HV) MOSFET forming region 41 on the substrate 10, and the gate insulating film 26 for the high-voltage (HV) MOSFET 51 is formed in the groove by thermal oxidation. In this case, the gate insulating film 24 for the low-voltage (LV) MOSFET 53 is formed in the low-voltage (LV) MOSFET forming region 43 by thermal oxidation (step (d)).

Thereafter, a gate electrode film of a low-voltage MOSFET is formed on the entire surface of the semiconductor substrate (step (e)). For example, as described with reference to FIG. 3, the gate electrode film 31 is formed on the surface of the semiconductor device 1 shown in FIG. 2, for example, by depositing a polysilicon film. As described with reference to FIG. 6, the gate electrode film 32 may be formed on the gate electrode film 31 by further depositing a polysilicon film. Thereby, the gate electrode layer of MOSFETs 51 to 53 serves as a so-called two-layer polysilicon structure.

Further, thereafter, a region having a non-volatile memory FET (MONOS type FET) formed therein is opened, and the semiconductor surface of the semiconductor substrate is exposed (step (i)). For example, as described with reference to FIG. 8, a resist is applied onto the surface of the semiconductor device 1 shown in FIG. 7, the region having the MONOS type FET 54 for a non-volatile memory formed therein is opened by lithography, and the semiconductor surface of the substrate 10 is exposed by etching.

Further, thereafter, a charge storage three-layer film is formed by sequentially depositing a first potential barrier film, a charge storage film, and a second potential barrier film (step (m)). For example, as described with reference to FIG. 11, the potential barrier film 21, the charge storage film 22, and the potential barrier film 23 are sequentially formed on the surface of the semiconductor device 1 shown in FIG. 10. The potential barrier film 21 and the potential barrier film 23 are, for example, silicon oxide films, and the charge storage film 22 is, for example, a silicon nitride film or a silicon oxynitride film. These films are formed by a CVD method.

In the above-mentioned first embodiment, as described with reference to FIGS. 8 and 9, an example is illustrated in which the opening where the semiconductor surface of the substrate 10 is exposed is formed in the MONOS type FET forming region 44 (step (i)), and then the well ion implantation and the channel ion implantation are performed (steps (j) and (l)), but these ion implantations may be performed in a prior step. For example, the ion implantations may be performed along with the step (step (a)) of performing the well ion implantation and the channel ion implantation for the MOSFETs 51 to 53 of the respective breakdown voltages as described with reference to FIG. 1.

Further, thereafter, a gate electrode film of a non-volatile memory FET is formed on the formed charge storage three-layer film (step (n)). For example, as described with reference to FIG. 12, the gate electrode film 33 is formed on the surface of the semiconductor device 1 shown in FIG. 11, for example, by depositing a polysilicon film.

Thereby, the charge storage three-layer film does not receive heat stress due to thermal oxidation for forming a gate oxide film of a high-voltage (HV) MOSFET, and thus a deterioration in reliability can be suppressed.

In the above-mentioned first embodiment, a case in which STI is adopted as an element isolation region has been described, but another element isolation technique such as, for example, LOCOS (LOCal Oxidation of Silicon) may be adopted. In addition, an example has been described in which the STI is formed by a subsequent step of forming the gate insulating films 24 to 26 of the MOSFETs 51 to 53, but the STI 30 may be formed before the gate insulating films 24 to 26 are formed.

The manufacturing method described in the first embodiment with respect to other respective steps is illustrative, and the second embodiment is not limited thereto.

Formation of Well for MONOS Type FET

In the above-mentioned second embodiment, as described with reference to FIGS. 8 and 9, the opening in which the semiconductor surface of the substrate 10 is exposed is formed in the region having the MONOS type FET 54 for a non-volatile memory formed therein, and then the well ion implantation and the channel ion implantation are performed (steps (j) and (l)). The ion implantations are performed in case that the well ion implantation for the MONOS type FET 54 is omitted in the step of performing the well ion implantation and the channel ion implantation for the MOSFETs 51 to 53 of the respective breakdown voltages (step (a)), and the opening of the region having the MONOS type FET 54 formed therein that is required before the charge storage three-layer film (ONO film) is formed therein (step (m)) is instead formed (step (i)). In case that the well ion implantation for the MONOS type FET 54 is performed in the step (a), it is necessary to differentiate regions on which the ion implantation is performed by lithography for each well having a different impurity concentration.

By adopting the above-mentioned configuration, it is possible to form the well (third well 15) of the MONOS type FET 54 for a non-volatile memory through the ion implantation using the opening formed by the step (i), and to reduce the number of lithography processes as compared to a case where the well of the non-volatile memory FET 54 is formed before the step (b), similarly to the step (a) of forming the well regions of the normal MOSFETs (51 to 53) of a first breakdown voltage or a second breakdown voltage.

Removal of Resist before Formation of Channel for MONOS Type FET

The above-mentioned step (i) is a step of forming the resist 92 having an opening in the region 44 having the non-volatile memory FET 54 is formed therein, and exposing the semiconductor surface of the substrate 10 by etching. The resist 92 used for forming the opening may be cleaned off and removed (step (k)) after the well ion implantation of the step (j) and before the channel ion implantation of the step (l).

Therefore, it is possible to suppress the characteristic variation of the MONOS type FET 54. In case that the removal of the resist in the step (k) is neglected, in the ion implantation step of the step (j), there is a concern that organic foreign matter may be attached to the substrate surface, and an impurity concentration due to the ion implantation of the step (l) may vary between the elements. Since the foreign matter is also cleaned off and removed by the removal of the resist in the step (k), the variation of the impurity concentration in the channel of the MONOS type FET 54 is suppressed.

Third Embodiment

Prevention of Oxidation of Gate Electrode Film

In case that a manufacturing method is adopted in which a gate oxide film and a polysilicon film of a MOSFET are formed on the entire surface on the semiconductor substrate, and then a polysilicon film for forming an ONO film and a gate electrode of a MONOS type FET are formed, it is understood that a variation may occur in the threshold voltage of the MOSFET. Inventors have found that in case that a silicon oxide film is formed on the polysilicon film formed in the step (e) that is a gate electrode film of the MOSFET, a variation may occur in the threshold voltage of the MOSFET on the P channel side. Inventors have ascertained that the variation of the threshold voltage is conspicuous particularly in a low-voltage P channel MOSFET, does not occur in case that the formation of the ONO film is omitted experimentally, does not occur in a manufacturing method for forming the ONO film in advance, and the like. Therefore, in a step of forming a silicon oxide film on the polysilicon film that is a gate electrode layer, this is caused by the polysilicon film being acceleratedly oxidized, and an impurity within the polysilicon film being diffused up to the channel region of the MOSFET. The impurity within the polysilicon film is boron (B). In case that it is estimated that the impurity passes through the thin gate insulating film of the low-voltage P channel MOSFET, and reaches the channel, this coincides with the above experimental result.

A manufacturing method for a semiconductor device 1 according to a third embodiment in order to solve such a problem is a manufacturing method for a semiconductor device including a MONOS type FET and a MOSFET, and is configured as follows.

A gate oxide film is formed in a region having a MOSFET on the substrate formed therein (step (d)). For example, as described with reference to FIG. 2, the gate insulating film 24 is formed in a region having the LVMOSFET 53 on the substrate 10 formed therein. In this case, as described with reference to FIG. 2, the gate insulating films 26 and 25 of the other breakdown voltage MOSFETs 51 and 52 may be formed concurrently (almost in tandem).

Thereafter, subsequently to the step (d), a polysilicon film is formed in the region having the MOSFET formed therein (step (e)). For example, as described with reference to FIG. 3, the gate electrode film 31 is formed on the surface of the semiconductor device 1 shown in FIG. 2, for example, by depositing a polysilicon film. As described with reference to FIG. 6, the gate electrode film 32 may be formed by further depositing a polysilicon film on the gate electrode film 31. Thereby, the gate electrode layer of the MOSFETs 51 to 53 is formed of a so-called two-layer polysilicon structure.

Further, thereafter, subsequent to the step (e), an anti-oxidation film is formed on the polysilicon film that is a gate electrode film (for example, gate electrode film 31 or gate electrode film 32 in a case of two-layer polysilicon) (step (h)). For example, as described with reference to FIG. 7, the silicon nitride film 34 is formed on the surface of the semiconductor device 1 shown in FIG. 6, that is, on the gate electrode film 32 by a CVD method. This silicon nitride film 34 functions as the anti-oxidation film 34 that prevents the gate electrode film 32 from being oxidized in a subsequent step of forming a silicon oxide film. In case that the gate electrode layer is not formed of a so-called two-layer polysilicon structure, the anti-oxidation film 34 is formed directly on the gate electrode film 31. Here, an example is shown in which the anti-oxidation film 34 is formed of a silicon nitride film, but materials capable of preventing radical oxygen from infiltrating into the gate electrode film 32 (or 31) in the subsequent step of forming a silicon oxide film may be used, and, silicate compounds such as, for example, hafnium (Hf), zirconium (Zr), aluminum (Al), or titanium (Ti) may be used.

Further, thereafter, subsequently to the step (h), the region having the MONOS type FET formed therein is opened, and the semiconductor surface of the semiconductor substrate is exposed (step (i)). For example, as described with reference to FIG. 8, a resist is applied onto the surface of the semiconductor device 1 shown in FIG. 7, the region having the MONOS type FET 54 for a non-volatile memory formed therein is opened by lithography, and the semiconductor surface of the substrate 10 is exposed by etching.

Further, thereafter, subsequently to the step (i), a charge storage three-layer film is formed by sequentially depositing a first potential barrier film, a charge storage film, and a second potential barrier film (step (m)). For example, as described with reference to FIG. 11, the potential barrier film 21, the charge storage film 22, and the potential barrier film 23 are sequentially formed on the surface of the semiconductor device 1 shown in FIG. 10. The potential barrier film 21 and the potential barrier film 23 are, for example, silicon oxide films, and the charge storage film 22 is, for example, a silicon nitride film ($SiN$, $Si_3N_4$) or a silicon oxynitride film ($SiON$). These films are formed by a CVD method.

Therefore, even in case that a manufacturing method is adopted in which a gate oxide film and a polysilicon film of a MOSFET are formed on the entire surface on the semiconductor substrate, and then an ONO film of the MONOS type FET and a polysilicon film that is a gate electrode film are formed, it is possible to suppress the occurrence of a variation in the threshold voltage of the MOSFET.

The manufacturing method described in the first embodiment with respect to other respective steps is illustrative, and the third embodiment is not limited thereto.

Fourth Embodiment

Channel Ion Implantation from Both Oblique Directions

Figure 21:
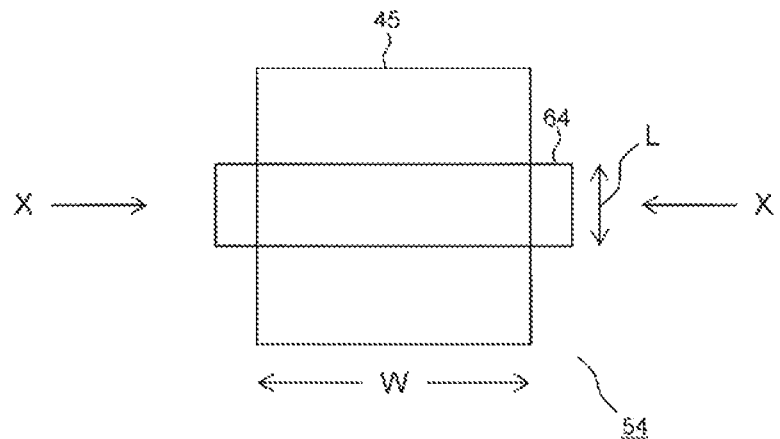
FIG. 21 is a schematic layout pattern diagram in case that the MONOS type FET is viewed from an upper surface.

FIG. 21 is a schematic layout pattern diagram in case that the MONOS type FET 54 is viewed from the upper surface.

The MONOS type FET 54 constituting a non-volatile memory is formed in a region 45 surrounded by the element isolation region 30 such as, for example, STI, the gate electrode 64 is formed from one STI 30 across the other STI 30 in the direction of a channel width (W), and a source region and a drain region are formed with the gate electrode 64 interposed therebetween. For this reason, an inside current channel away from the sidewall of the STI 30 and a current channel on both sides formed along the channel in the vicinity of the sidewall are present in the direction of a channel length (L). Inventors have found that in the vicinity of the sidewall of the STI 30, since an impurity concentration becomes non-uniform or the disturbance of an electric field occurs, there may be a concern of so-called kink characteristics being shown in which a threshold voltage for controlling the current channel on both sides and a threshold voltage for controlling the inside current channel are effectively different from each other. In the non-volatile memory, since information is stored by a change in the threshold voltage of the MONOS type FET, there may be a concern that the kink characteristics make a write margin smaller.

Figure 25:
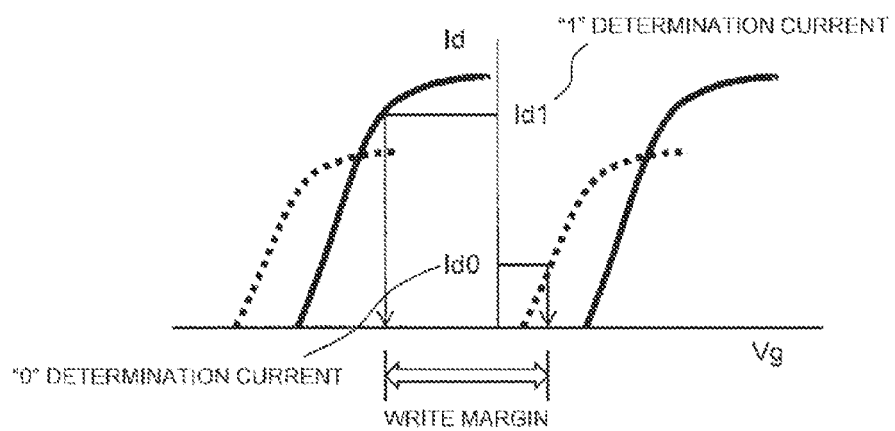
FIG. 25 is a diagram illustrating the electrical characteristics of the MONOS type FET having kink characteristics.
Figure 26:
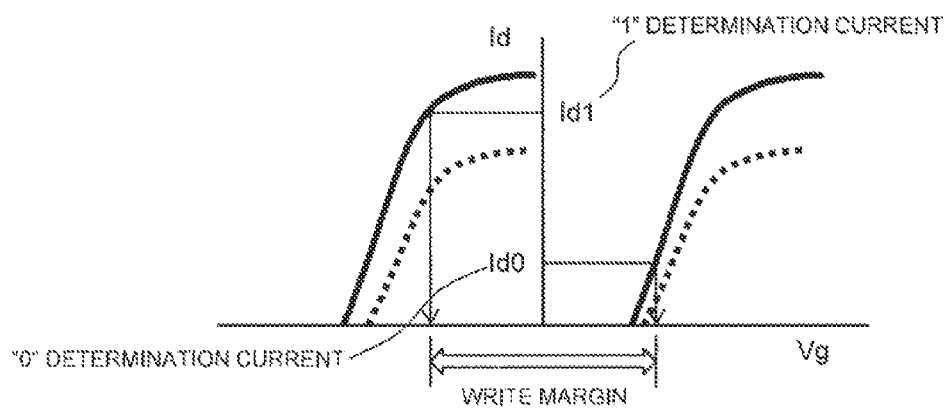
FIG. 26 is a diagram illustrating the normal electrical characteristics of the MONOS type FET.

FIG. 25 is a diagram illustrating the electrical characteristics of the MONOS type FET 54 having kink characteristics, and FIG. 26 is a diagram illustrating the normal electrical characteristics of the MONOS type FET 54. The MONOS type FET 54 constituting a non-volatile memory has characteristics that a threshold voltage fluctuates depending on whether carriers are trapped in the charge storage layer, and stores information using the characteristics. In FIGS. 25 and 26, the horizontal axis is a gate voltage and the vertical axis is a drain current, and the static characteristics of the MONOS type FET 54 in respective cases that carriers are trapped and are not trapped are illustrated. Solid lines are the characteristics of a drain current in the inside current channel away from the sidewall of the STI 30, broken lines are the characteristics of a drain current in the current channel both sides in the vicinity of the sidewall of the STI 30, and actual static characteristics are the sum (not shown) of the solid line and the broken line. In the normal electrical characteristics shown in FIG. 26, a threshold voltage for controlling the current channel on both sides and a threshold voltage for controlling the inside current channel are coincident with each other. However, in the electrical characteristics shown in FIG. 25, since the threshold voltage for controlling the current channel on both sides is lower than normal, and is different from the threshold voltage for controlling the inside current channel, a place having a sharp change in kink, that is, inclination appears in the static characteristics that are the sum (not shown) thereof.

Such kink characteristics do not have a very serious problem in the normal MOSFET for constituting a digital circuit. However, in the MONOS type FET for constituting a non-volatile memory, there may be a concern of a serious problem occurring. In the non-volatile memory, a circuit is configured so that the stored information is determined to be "1" in case of drain current Id=Id1, the stored information is determined to be "0" in case of drain current Id=Id0. The stored information of being "1" is determined by the threshold voltage in case of drain current Id=Id1, and is determined by the threshold voltage for controlling the inside current channel in both the normal electrical characteristics shown in FIG. 26 and the electrical characteristics having kink characteristics shown in FIG. 25. The stored information of being "0" is determined by the threshold voltage in case of drain current Id=Id0, and is determined by the threshold voltage for controlling the inside current channel in the normal electrical characteristics shown in FIG. 26, whereas is determined by the threshold voltage for controlling the current channel on both sides of which the threshold voltage is lowered, in the electrical characteristics having kink characteristics shown in FIG. 25. For this reason, a write margin in case of having kink characteristics shown in FIG. 25 becomes remarkably smaller (narrower) than a write margin in case of being normal as shown in FIG. 26.

In this manner, in the MONOS type FET for constituting a non-volatile memory, the kink characteristics have a remarkably larger influence on circuit characteristics than the normal MOSFET for constituting a digital circuit. Such a problem is not limited to a MONOS type, and can commonly occur in all the FETs used in a circuit sensitive to a fluctuation in threshold voltage. For example, the above type is an FET used in an analog circuit requiring linearity.

In order to solve such a problem, a manufacturing method for a semiconductor device 1 according to a fourth embodiment is a manufacturing method for a semiconductor device in which an FET is formed and configured as follows.

Figure 22:
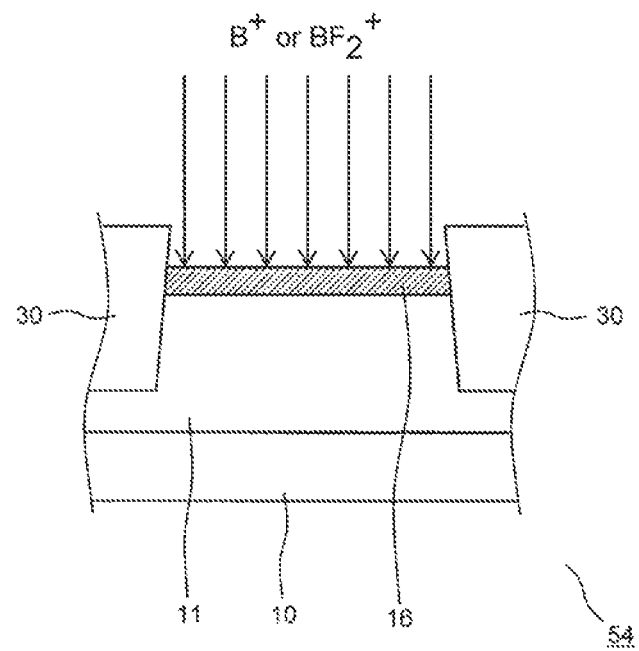
FIG. 22 is a schematic cross-sectional view (cross-section X-X of FIG. 21) illustrating the semiconductor device in order to explain a channel ion implantation step of the MONOS type FET.

An insulating layer that isolates the FET from other elements is formed (step (f)). An example thereof is shown in FIG. 22. FIG. 22 is a schematic cross-sectional view (cross-section X-X of FIG. 21) illustrating the semiconductor device 1 in order to explain a channel ion implantation step of the MONOS type FET 54. FIG. 22 shows only a region having the MONOS type FET 54 formed therein. The N-type well 11 and the STI 30 are formed on the surface of the substrate 10, and the P-type channel region 16 is formed by implanting boron ions ($B^+$) or boron fluoride ions ($BF_2^+$) from a direction perpendicular to the surface of the substrate 10 (step (l0)).

Figure 23:
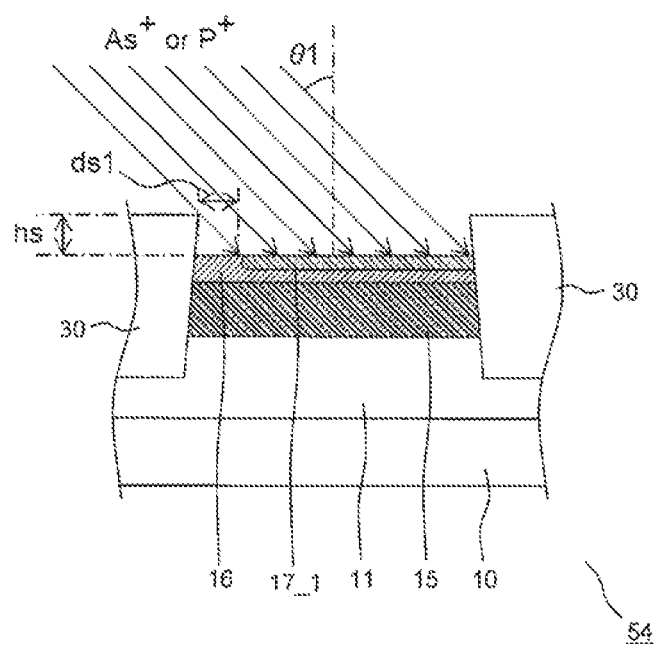
FIG. 23 is a schematic cross-sectional view (cross-section X-X of FIG. 21) illustrating the semiconductor device in order to explain an oblique ion implantation step of a channel region of the MONOS type FET from one side.

Subsequently to the step (f), impurity ions are implanted from a direction that is substantially perpendicular to the direction of the channel length (L) of the FET and is inclined at a predetermined first angle ($\theta$) from the normal direction of the surface of the semiconductor substrate (step (l1)). An example thereof is shown in FIG. 23. FIG. 23 is a schematic cross-sectional view (cross-section X-X of FIG. 21) illustrating the semiconductor device 1 in order to explain an oblique ion implantation step from one side to the channel region of the MONOS type FET 54. The N-type well 11, the P-type well 15, the P-type channel region 16, and the STI 30 are formed on the substrate 10, and arsenic ions ($As^+$) or phosphorus ions ($P^+$) are implanted from a direction that is substantially perpendicular to the direction of the channel length (L) of the MONOS type FET 54 and is inclined at a predetermined first angle ($\theta 1$) from the normal direction of the surface of the substrate 10. Here, the wording "substantially perpendicular to the direction of the channel length (L) of the FET" does not mean accurately 90°, and may not preferably be a direction that is perpendicular to the direction of the channel width (W). The same is true of other places described. Impurity ions are implanted into a region 17_1 excluding a region having a width ds1 from the sidewall of the STI 30 on the left side of the drawing, in the P-type channel region 16.

Figure 24:
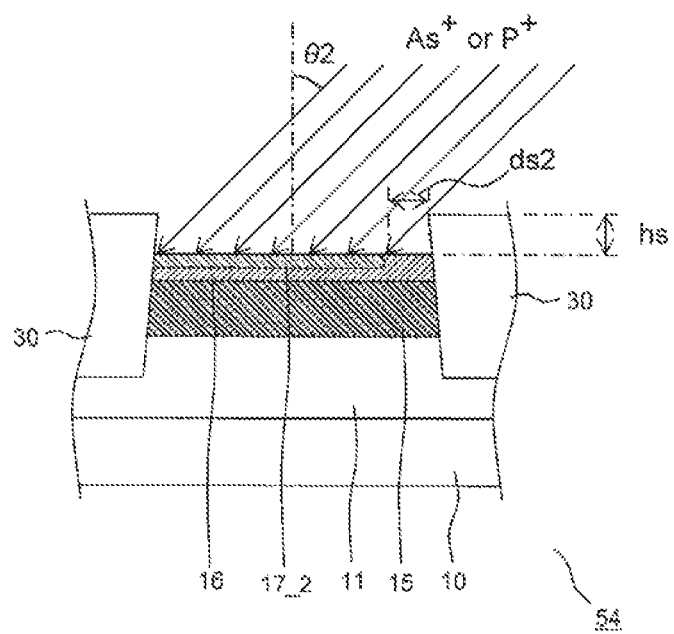
FIG. 24 is a schematic cross-sectional view (cross-section X-X of FIG. 21) illustrating the semiconductor device in order to explain an oblique ion implantation step of the channel region of the MONOS type FET from the other side.

Next, impurity ions are implanted from a direction that is substantially perpendicular to the direction of the channel length and is inclined at a predetermined second angle reverse to the first angle from the normal direction of the surface of the semiconductor substrate (step (12)). An example thereof is shown in FIG. 24. FIG. 24 is a schematic cross-sectional view (cross-section X-X of FIG. 21) illustrating the semiconductor device 1 in order to explain an oblique ion implantation step from the other side to the channel region of the MONOS type FET 54. The N-type well 11, the P-type well 15, the P-type channel region 16, and the STI 30 are formed on the substrate 10, and arsenic ions (As$^+$) or phosphorus ions (P$^+$) are implanted from a direction that is substantially perpendicular to the direction of the channel length of the MONOS type FET 54 and is inclined at a second angle ($\theta 2$) reverse to the first angle ($\theta 1$) from the normal direction of the surface of the substrate 10. Impurity ions are implanted into a region 17_2 excluding a region having a width ds2 from the sidewall of the STI 30 on the left side of the drawing, in the P-type channel region 16.

In the examples described with reference to FIGS. 22 to 24, the steps (11) and (12) are counter ion implantation steps of implanting reverse conductive donor impurity ions into the P-type channel region 16 formed by the step (10). Therefore, it is possible to further increase controllability in case that a fluctuation in threshold voltage is suppressed. In case that the step (10) is a so-called normal channel ion implantation step and a step of implanting, for example, acceptor impurity (of which the semiconductor conductivity type is set to a P type in case of being activated within a semiconductor) ions from the ordinary normal direction of the surface of the semiconductor substrate, the steps (11) and (12) are steps of implanting reverse donor impurity (of which the semiconductor conductivity type is set to a reverse N type in case of being activated within a semiconductor) ions. The concentration of the impurities implanted in the step (10) can be reduced by the ion implantation of the steps (11) and (12). In this case, the ion implantation of the steps (11) and (12) is called counter ion implantation to the ion implantation of the step (10). Conversely, the dose of the step (10) may be made lower, and be caused to function as the counter ion implantation of the ion implantation of the steps (11) and (12). Since a dose is adjusted generally at a desired impurity concentration in so-called normal ion implantation, and impurity concentration is adjusted by both-oblique-direction ion implantation of the steps (11) and (12), it is possible to increase the degree of freedom of adjustment, and to further increase controllability in case that a fluctuation in threshold voltage is suppressed.

The basic technical idea of the fourth embodiment is not limited to the MONOS type FET 54, and is also not limited to the counter ion implantation.

An insulating layer which is typified by the STI 30 is formed higher by height hs than the semiconductor surface of the semiconductor substrate 10, spaced apart by a channel width W, on both sides in the direction (X-X direction) of the channel width W of the channel region of the FET. The region having a width ds1 from one sidewall of the STI 30 in the channel width W is shaded by the STI 30 through the oblique ion implantation from the angle $\theta 1$ of the step (11) and thus impurity ions are not implanted into the region, whereas impurity ions are implanted into the region 17_1. The region having a width ds2 from the other sidewall of the STI 30 in the channel width W is shaded by the STI 30 through the oblique ion implantation from the reverse angle $\theta 2$ in the next step (12) and thus impurity ions are not implanted into the region, whereas impurity ions are implanted into the region 17_2. Thereby, the region having the width ds1 from one side of the vicinity of the sidewall of the STI 30 and a region (region in which the region 17_1 and region 17_2 overlap each other) located at the center of the channel other than the region having the width ds2 from the other side have impurity concentration according to the sum of doses from both sides of the ion implantation of the steps (11) and (12), whereas a region in the vicinity of the sidewall has impurity concentration specified by only the dose of each ion implantation. In this manner, the dose of the ion implantation to the vicinity of the sidewall of the STI 30 and the dose to the central portion can be made different from each other in a self-aligned manner. Thereby, since it is possible to adjust the amount of impurities implanted into each of the inside current channel away from the sidewall of the STI 30 and the current channel on both sides formed along the vicinity of the sidewall, and to suppress the occurrence of the kink characteristics, the write margin of the non-volatile memory is improved.

The ion implantation of the steps (11) and (12) can be used as the channel ion implantation for determining the impurity concentration of the channel, and can also be used as the counter ion implantation to the ion implantation of the step (10) as stated above.

It is preferable that the angle $\theta 1$ and the angle $\theta 2$ be set to 45° ($\theta 1 \approx -\theta 2 \approx 45°$) generally. Therefore, it is possible to stably control the size of the shaded region without reducing a range undesirably. Impurities can be distributed to have the peak of an impurity profile at a depth closer to the range determined by acceleration energy as it is shallower (closer to a direction perpendicular to the semiconductor substrate), whereas the sizes of the shaded regions ds1 and ds2 decrease, and factors fluctuating depending on the shape of the end of the STI insulating layer 30 increase. On the other hand, as the angles $\theta 1$ and $\theta 2$ of the both-oblique-direction ion implantation are larger (closer to a direction parallel to the surface of the semiconductor substrate), the peak of the impurity profile becomes shallower than the range determined by the acceleration energy. Therefore, in order to implant impurities at a desired depth, it is necessary to increase the acceleration energy. For this reason, the angle $\theta 1$ and the angle $\theta 2$ are not necessarily be accurately 45°, but are generally set to 45° most preferably.

Therefore, it is possible to provide a manufacturing method for a semiconductor device having good controllability that is capable of suppressing a fluctuation in threshold voltage within the channel region of the FET formed using the STI in element isolation with a high degree of accuracy.

The manufacturing method for a semiconductor device according to the fourth embodiment can be applied to the above-mentioned first embodiment.

As described with reference to FIGS. 4 and 5, the STI 30 located higher than the semiconductor surface of the substrate 10 is formed. The height thereof in this case is specified by the thickness of the CMP stopper film 29 and the margin of CMP. The margin of CMP as used herein indicates the amount of polishing which is continued to allow for a margin for preventing polishing residue from occurring after the emergence of the CMP stopper film 29 in a polished surface is detected. Therefore, it is possible to form an STI stepped difference with good controllability.

Thereafter, as described with reference to FIG. 9, the well ion implantation is performed on an opening formed in the non-volatile memory region 44. Thereafter, as described with reference to FIG. 10, the resist 92 is removed from the surface of the semiconductor device 1 shown in FIG. 8, and then impurities are introduced by ion implantation, and thus the channel region 16 for the MONOS type FET 54 is formed in the vicinity of the surface within the substrate 10 of the MONOS type FET forming region 44. The impurity concentration of the channel region is adjusted by this ion implantation (channel ion implantation), and the threshold voltage of the MONOS type FET 54 is adjusted. In this ion implantation, it is possible to perform the ion implantation of the above-mentioned steps (l1) and (l2) or the ion implantation inclusive of the step (l0).

As described above, with respect to the semiconductor device 1 including the MONOS type FET 54 having a charge storage film within a gate insulating film and three types of MOSFETs 51 to 53 of a high-voltage, a middle-voltage, and a low-voltage, the ion implantation step according to the third embodiment is applied to the MONOS type FET 54 having a particularly conspicuous influence of the kink characteristics. Thereby, since it is possible to adjust the amount of impurities implanted into each of the inside current channel away from the sidewall of the STI 30 and the current channel on both sides formed along the vicinity of the sidewall, and to suppress the occurrence of the kink characteristics, the write margin of the non-volatile memory is improved. Since the size of a region in which a dose is lowered can be specified by the height hs of the sidewall of the STI 30 and the angles $\theta 1$ and $\theta 2$ of ion implantation, it is possible to provide a manufacturing method having good controllability.

In the first embodiment, an example is illustrated in which the ion implantation step according to the fourth embodiment is applied to only the MONOS type FET 54 as described above, but the step may be applied to the other MOSFETs 51 to 53 similarly. For example, it is effective in case that an analog circuit requiring high linearity is constituted by the other MOSFETs 51 to 53.

In order to apply the fourth embodiment to the first embodiment, as described above, before the channel ion implantation, the sidewall or the like of the STI 30 having a height for creating a shadow at the side of the ion implantation region may preferably be formed. The context between the steps of forming the STI 30, the wells 12 to 15, and the gate insulating films 24 to 26 can be changed arbitrarily. In addition, the manufacturing method described in the first embodiment with respect to other respective steps is illustrative, and the fourth embodiment is not limited thereto.

Fifth Embodiment

Prevention of Etching Damage to Gate Electrode of MONOS Type FET

In the manufacturing method for a semiconductor device according to the first embodiment, the gate electrode 64 of the MONOS type FET 54 is formed and patterned, and then the gate electrodes 61 to 63 of the MOSFETs 51 to 53 are patterned. For this reason, as shown in FIG. 18, a lithography process is performed in which the entire surface of the substrate 10 is covered with a resist film, and the region 44 of the MONOS type FET and the regions having the gate electrodes 61 to 63 of the MOSFETs 51 to 53 are formed are left behind and opened. In this case, the resist film 94 is applied with a substantially uniform film thickness. However, since the gate electrode 64 is previously patterned in the region 44 of the MONOS type FET 54, the thickness of the resist film 94 on the gate electrode 64 becomes smaller than other regions in order to bury the irregularities thereof. For this reason, in the etching step of removing a polysilicon film in which the gate electrodes 61 to 63 of the MOSFETs 51 to 53 are formed, except for a gate electrode portion, since the resist film 94 is also etched simultaneously, there is a concern that the resist film 94 formed thinner than other regions on the gate electrode 64 of the MONOS type FET 54 from the beginning may disappear, and the gate electrode 64 of the MONOS type FET 54 may be exposed, and etching damage may be suffered.

In order to solve such a problem, a manufacturing method for a semiconductor device 1 according to a fifth embodiment is a manufacturing method for the semiconductor device 1 including the non-volatile memory FET 54 and the MOSFETs 51 to 53, and is configured as follows.

A first gate electrode film 31 is formed on the entire surface of the semiconductor substrate (step (e)). For example, as described with reference to FIG. 3, the first gate electrode film 31 is formed by depositing a polysilicon film using a CVD method.

Thereafter, the region having the non-volatile memory FET 54 formed therein is opened, and the semiconductor surface of the substrate 10 is exposed (step (i)). For example, as described with reference to FIG. 8, a resist is applied onto the surface of the semiconductor device 1 shown in FIG. 7, that is, on the anti-oxidation film 34, and the non-volatile memory MONOS type FET forming region 44 is opened by lithography. The anti-oxidation film 34, the polysilicon film 32, the first gate electrode film 31, and the gate insulating film 24 are removed by etching, using the resist 92 having an opening in the MONOS type FET forming region 44 as a mask. Here, the first embodiment is an example in which the polysilicon film 32 and the anti-oxidation film 34 are formed on the gate electrode film 31, but in the fifth embodiment, the formation of the first gate electrode film serving as the gate electrodes 61 to 63 of the MOSFETs 51 to 53 is required, and the structure of the film is arbitrary.

Further, thereafter, a charge storage three-layer film 20 is formed by sequentially depositing a first potential barrier film 21, a charge storage film 22, and a second potential barrier film 23 (step (m)). For example, as described with reference to FIG. 11, the potential barrier film 21, the charge storage film 22, and the potential barrier film 23 are sequentially formed on the surface of the semiconductor device 1 shown in FIG. 10. The potential barrier film 21 and the potential barrier film 23 are, for example, silicon oxide films, and the charge storage film 22 is, for example, a silicon nitride film or a silicon oxynitride film. These films are formed by a CVD method.

Further, thereafter, a third gate electrode film is formed on the charge storage three-layer film (step (n)). For example, as described with reference to FIG. 12, a polysilicon film is deposited on the surface of the semiconductor device 1 shown in FIG. 11, for example, by a CVD method, and is doped with impurities such as phosphorus (P) at a high concentration to achieve a reduction in resistance, thereby allowing the third gate electrode film 33 to be formed. The third gate electrode film 33 serves as a gate electrode 64 of the MONOS type FET 54. In this case, it is preferable that the third gate electrode film 33 be deposited with a thickness smaller than the sum of the thickness of the first gate electrode film 31 and the thickness of the polysilicon film 32. In a subsequent step described with reference to FIG. 18, this is because the thickness of a resist film on the gate electrode 64 of the MONOS type FET 54 is prevented from becoming excessively small.

Further, thereafter, a gate electrode of the non-volatile memory FET is patterned (step (o)). For example, as described with reference to FIGS. 14 and 15, a resist film 93 is formed, using lithography, in a portion in which the gate electrode 64 for the MONOS type FET 54 is formed, and a portion in which a wiring located on the same layer as the gate electrode 64 is formed, and the silicon oxide film 35 and the third gate electrode film 33 are removed by etching, using the formed resist film 93 as a mask. After etching, the resist film 93 is also cleaned off and removed. In this case, the gate electrode 64 is constituted by two layers of the silicon oxide film 35 and the third gate electrode film 33.

Further, thereafter, a resist film is formed, using lithography, in a region of the non-volatile memory FET and a region having the first gate electrode of the first breakdown voltage MOSFET formed therein (step (p)). For example, as described with reference to FIG. 18, a resist film 94 is formed, using lithography, in portions in which the gate electrodes 61 to 63 for the MOSFETs 51 to 53 are formed, and a portion in which a wiring located on the same layer as the gate electrodes 61 to 63 is formed.

Further, thereafter, the first gate electrode film which is not covered with the resist film formed in the step (p) is etched (step (q)). For example, as described with reference to FIG. 19, the first gate electrode layer 31 and the polysilicon film 32 are removed by etching, using the formed resist 94 as a mask. After etching, the resist 94 is also cleaned off and removed.

Here, the value of the product of S/L and H/L is specified in case that the line of the gate electrode of the non-volatile memory FET is set to L, the space thereof is set to S, and the height thereof is set to H so that in the step (p), the thickness of the resist film on the gate electrode of the non-volatile memory FET is set to a thickness which is not lost by the etching step of the step (q).

Therefore, it is possible to suppress etching damage to the gate electrode of the MONOS type FET in the etching step of patterning the gate electrode of a MOSFET.

The more detailed description will be given of a method of specifying the product of S/L and H/L so that the thickness of the resist film 94 on the gate electrode of the non-volatile memory FET mentioned above is set to a thickness which is not lost by the etching step of the step (q).

Figure 27:
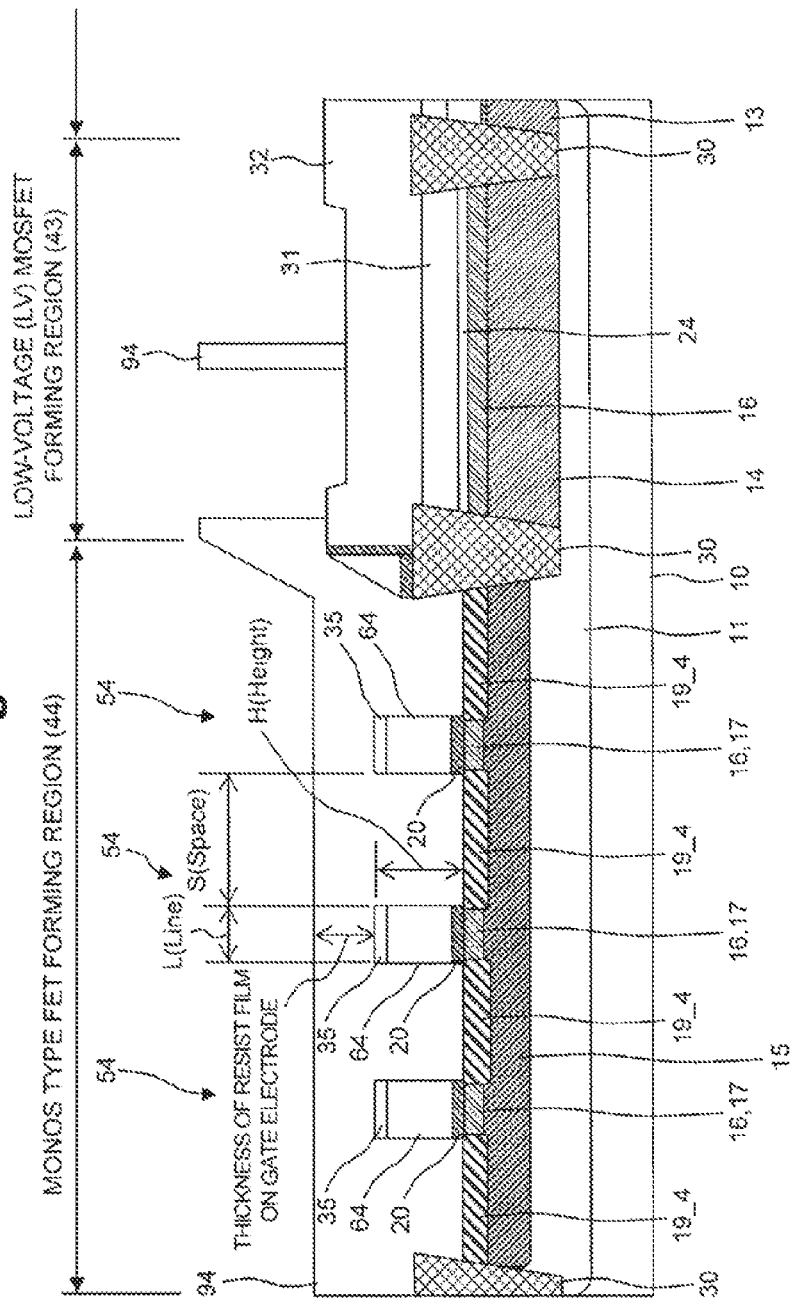
FIG. 27 is a schematic cross-sectional view illustrating the semiconductor device showing a structure of a plurality of gate electrodes of the MONOS type FET in the course of a manufacturing method (after a lithography process for patterning the gate electrodes for a MOSFET).

FIG. 27 is a schematic cross-sectional view illustrating the semiconductor device 1 showing in a structure of a plurality of gate electrodes of the MONOS type FET 54 in the course of a manufacturing method (after a lithography process for patterning the gate electrodes 61 to 63 for a MOSFET). The drawing is configured as a halfway step of the same manufacturing method as that of FIG. 18, and thus the description of the same components as those in FIG. 18 will not be given. The gate electrodes 64 of a plurality of MONOS type FETs 54 are formed within one MONOS type FET forming region 44 with the STIs 30 interposed between both sides. The line of the gate electrode 64 is set to L (Line), the space thereof is set to S (Space), and the height thereof is set to H (Height).

Figure 28:
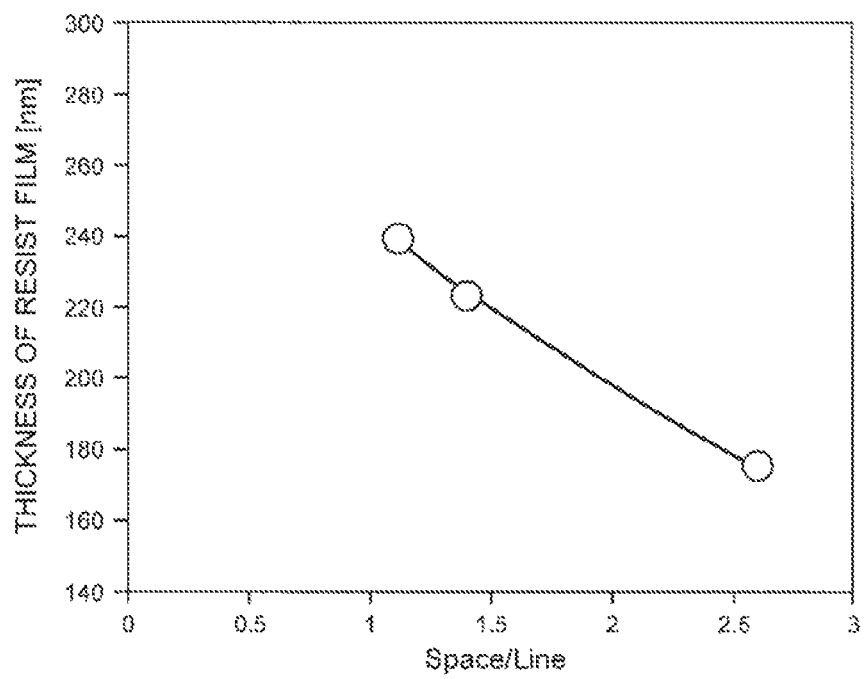
FIG. 28 is a graph illustrating experimental results regarding a relationship between the space/line ratio of the gate electrode of the MONOS type FET and the thickness of a resist film on the gate electrode.

FIG. 28 is a graph illustrating experimental results regarding a relationship between the space/line ratio of the gate electrode of the MONOS type FET 54 and the thickness of a resist film on the gate electrode. The horizontal axis represents a Space/Line ratio, and the vertical axis represents a thickness of the resist film 94 on the gate electrode 64 in this case. The thickness of the resist film in case of Space/Line=1 is 240 nm, and decreases as the Space/Line ratio increases.

Figure 29:
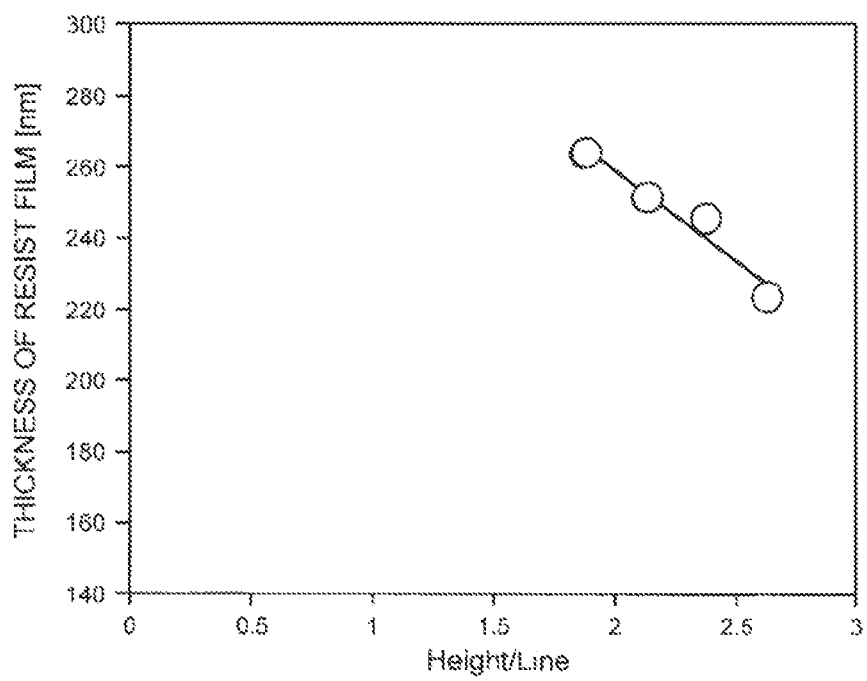
FIG. 29 is a graph illustrating experimental results regarding a relationship between the height/line ratio of the gate electrode of the MONOS type FET and the thickness of the resist film on the gate electrode.

FIG. 29 is a graph illustrating experimental results regarding a relationship between the height/line ratio of the gate electrode of the MONOS type FET 54 and the thickness of the resist film on the gate electrode. The horizontal axis represents a Height/Line ratio, and the vertical axis represents a thickness of the resist film 94 on the gate electrode 64 in this case. The thickness of the resist film in case of Height/Line=0.5 is 265 nm, and decreases as the Height/Line ratio increases.

Figure 30:
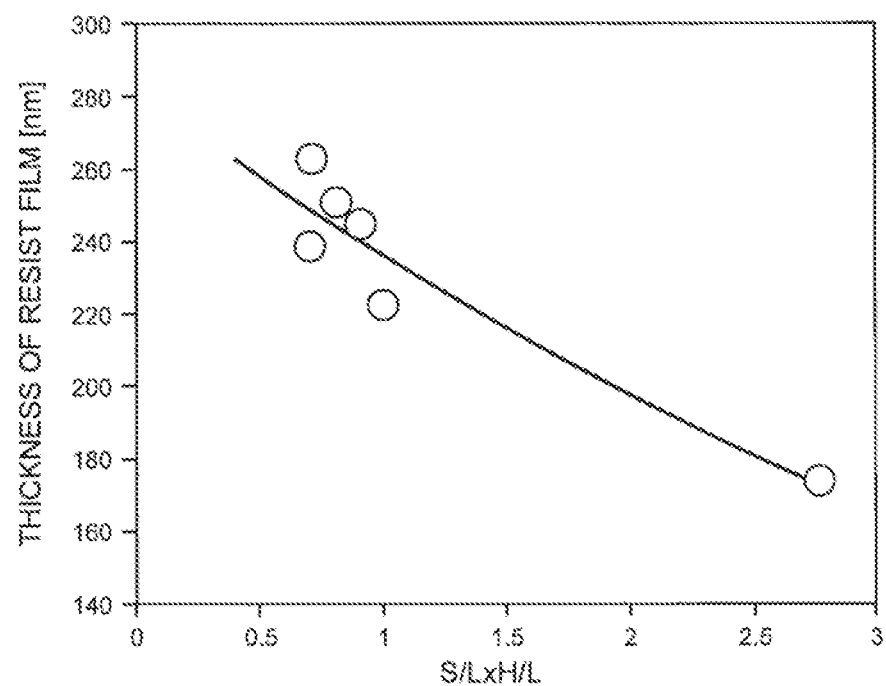
FIG. 30 is a graph illustrating experimental results regarding a relationship between the value of space/line×height/line (S/L×H/L) of the gate electrode of the MONOS type FET and the thickness of the resist film on the gate electrode.

FIG. 30 is a graph illustrating experimental results regarding a relationship between the value of space/line×height/line (S/L×H/L) of the gate electrode of the MONOS type FET 54 and the thickness of the resist film on the gate electrode. The horizontal axis represents a value of space/line×height/line (S/L×H/L) which is the product of the Space/Line ratio and the Height/Line ratio, and the vertical axis represents a thickness of the resist film 94 on the gate electrode 64 in this case. The thickness of the resist film in case of S/L×H/L=1 is 240 nm, and decreases as the value of S/L×H/L increases. The appropriate value of S/L×H/L is specified so that the thickness of the resist film 94 on the gate electrode 64 is set to a thickness which is not lost by the etching step of the step (q). For example, in case that the thickness of the resist film 94 is 200 nm, the value of S/L×H/L is suppressed to a value smaller than 2.

Here, the line L and the space S are optimized generally so as to minimize the area of a memory cell of a non-volatile memory constituted by the MONOS type FET 54, and thus may be set so that the height H of the gate electrode 64 is made smaller, that is, the thickness of the third gate electrode film 33 becomes smaller than the thicknesses of the first gate electrode film 31 and the polysilicon film 32 of a MOSFET.

Thereby, it is possible to suppress etching damage to the gate electrode of the MONOS type FET in the etching step of patterning the gate electrode of a MOSFET.

The fifth embodiment can be widely applied to a manufacturing method for a semiconductor device in which the gate electrode 64 of the MONOS type FET 54 is formed and patterned, and then the gate electrodes 61 to 63 of the MOSFETs 51 to 53 are patterned, and each relevant step for applying the fifth embodiment to the first embodiment has been described. The manufacturing method described in the first embodiment with respect to other respective steps is illustrative, and the fifth embodiment is not limited thereto.

As stated above, while the present invention devised by the inventor has been described specifically based on the first and fifth embodiments, the present invention is not limited thereto, and it goes without saying that various changes and modifications may be made without departing from the scope of the invention.

For example, examples in which all the second to fifth embodiments are applied to the first embodiment have been illustrated, but the application of some embodiments of these examples may be omitted.

What is claimed is:

1. A manufacturing method for a semiconductor device including a non-volatile memory FET and a first breakdown voltage MOSFET, comprising:
    (b) a step of forming a groove having a predetermined depth in a region on a semiconductor substrate having the first breakdown voltage MOSFET formed therein;
    (c) a step of forming a first oxide film within the groove through thermal oxidation after the step (b);
    (e) a step of forming a first gate electrode film on the first oxide film after the step (c);
    (i) a step of exposing a semiconductor surface of the semiconductor substrate in a region having the non-volatile memory FET formed therein after the step (e);
    (m) a step of forming a charge storage three-layer film by sequentially depositing a first potential barrier film, a charge storage film, and a second potential barrier film after the step (i); and
    (n) a step of forming a second gate electrode film on the charge storage three-layer film after the step (m).

2. The manufacturing method for a semiconductor device according to claim 1, wherein the first potential barrier film and the second potential barrier film are silicon oxide films, and the charge storage film is a silicon nitride film or a silicon oxynitride film.

3. The manufacturing method for a semiconductor device according to claim 1, wherein the semiconductor device further includes a second breakdown voltage MOSFET, the method further comprising:
(d) a step of forming a second oxide film through thermal oxidation after the step (c) and before the step (e).

4. The manufacturing method for a semiconductor device according to claim 1, further comprising:
(a) a step of forming a resist film having an opening in the region on the semiconductor substrate having the first breakdown voltage MOSFET formed therein, through lithography before the step (b), and forming a first well within the semiconductor substrate through ion implantation; and
(j) a step of forming a third well in the region having the non-volatile memory FET formed therein, through ion implantation, after the step (i) and before the step (m).

5. The manufacturing method for a semiconductor device according to claim 4, wherein the step (i) is a step of forming a first resist film having an opening in the region having the non-volatile memory FET formed therein, and exposing the semiconductor surface of the semiconductor substrate through etching, the method further including:
(k) a step of removing the first resist film after the step (j) and before the step (m); and
(l) a step of implanting impurity ions into a shallower region within the semiconductor substrate than that in the ion implantation of the step (j), after the step (k) and before the step (m).

6. The manufacturing method for a semiconductor device according to claim 1, further comprising:
(f1) a step of forming a CMP stopper film on the first gate electrode film after the step (e);
(f2) a step of forming an element isolation groove in an element isolation region that isolates a plurality of the non-volatile memory FETs and a plurality of the first breakdown voltage MOSFETs from each other, after the step (f1);
(f3) a step of burying the element isolation groove after the step (f2), and further forming an insulating film on the entire surface of the semiconductor substrate;
(f4) a step of polishing the surface of the semiconductor substrate until the CMP stopper film is exposed, through chemical mechanical polishing (CMP), after the step (f3);
(f5) a step of selectively removing the CMP stopper film after the step (f4) and before the step (i);
(j) a step of forming a third well in the region having the non-volatile memory FET formed therein, through ion implantation, after the step (i); and
(l) a step of implanting impurity ions in a shallower region within the semiconductor substrate than that in the ion implantation of the step (j), after the step (j) and before the step (m),
the ion implantation of the step (l) including a step of implanting impurity ions from a direction that is substantially perpendicular to a direction of a channel length of the non-volatile memory FET formed in the opening formed by the step (i) and is inclined at a predetermined first angle from a direction perpendicular to the surface of the semiconductor substrate, and a step of implanting impurity ions from a direction that is substantially perpendicular to the direction of the channel length and is inclined at a predetermined second angle reverse to the first angle from a direction perpendicular to the surface of the semiconductor substrate.

7. The manufacturing method for a semiconductor device according to claim 6, wherein the first gate electrode film is a polysilicon film, and the insulating film in the step (f3) is a silicon oxide film, and
the step (i) includes an etching step in which an etching rate for polysilicon is higher than an etching rate for the silicon oxide film.

8. The manufacturing method for a semiconductor device according to claim 6, wherein the first angle and the second angle are generally 45°.

9. The manufacturing method for a semiconductor device according to claim 1, wherein the first gate electrode film is a polysilicon film to which impurities are added, and the first potential barrier film is a silicon oxide film, the method further comprising:
(h) a step of forming an anti-oxidation film on the first potential barrier film after the step (e) and before the step (i).

10. The manufacturing method for a semiconductor device according to claim 9, wherein the anti-oxidation film is a silicon nitride film.

11. The manufacturing method for a semiconductor device according to claim 1, wherein the first gate electrode film is a polysilicon film to which impurities are added, and the first potential barrier film is a silicon oxide film, the method further comprising:
(f1) a step of forming a CMP stopper film on the first gate electrode film after the step (e);
(f2) a step of forming an element isolation groove in an element isolation region that isolates a plurality of the non-volatile memory FETs and a plurality of the first breakdown voltage MOSFETs from each other, after the step (f1);
(f3) a step of burying the element isolation groove after the step (f2), and further forming an insulating film on the entire surface of the semiconductor substrate;
(f4) a step of polishing the surface of the semiconductor substrate until the CMP stopper film is exposed, through chemical mechanical polishing (CMP), after the step (f3);
(f5) a step of selectively removing the CMP stopper film after the step (f4);
(g) a step of forming a polysilicon film to which impurities are added, on the entire surface of the semiconductor substrate, after the step (f5); and
(h) a step of forming an anti-oxidation film on the polysilicon film, after the step (g) and before the step (i).

12. The manufacturing method for a semiconductor device according to claim 11, further comprising:
(j) a step of forming a third well in the region having the non-volatile memory FET formed therein, through ion implantation, after the step (i); and
(l) a step of implanting impurity ions in a shallower region within the semiconductor substrate than that in the ion implantation of the step (j), after the step (j) and before the step (m),
the ion implantation of the step (l) including a step of implanting impurity ions from a direction which is substantially perpendicular to a direction of a channel length of the non-volatile memory FET formed in the opening formed by the step (i) and is inclined at a predetermined first angle from a direction perpendicular to the surface of the semiconductor substrate, and a step of implanting impurity ions from a direction that is substantially perpendicular to the direction of the channel length and is inclined at a predetermined second angle reverse to the first angle from a direction perpendicular to the surface of the semiconductor substrate.

13. The manufacturing method for a semiconductor device according to claim 1, wherein the second gate electrode film is thinner than the first gate electrode film.

14. The manufacturing method for a semiconductor device according to claim 13, further comprising:
- (o) a step of patterning a gate electrode of the non-volatile memory FET after the step (n);
- (p) a step of forming a resist film in the region for the non-volatile memory FET and a region having a gate electrode of the first breakdown voltage MOSFET formed therein, through lithography, after the step (o);
- (q) a step of etching the first gate electrode film which is not covered with the resist film formed in the step (p), after the step (p),
- a value of a product of S/L and H/L being specified in case that a line of the gate electrode of the non-volatile memory FET is set to L, a space thereof is set to S, and a height thereof is set to H so that a thickness of the resist film, formed in the step (p), on the gate electrode of the non-volatile memory FET is set to a thickness which is not lost by the etching step of the step (q).

* * * * *